(12) United States Patent
Lee

(10) Patent No.: US 9,853,051 B1
(45) Date of Patent: Dec. 26, 2017

(54) SEMICONDUCTOR DEVICE AND METHOD OF MANUFACTURING THE SAME

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/349,518

(22) Filed: Nov. 11, 2016

(30) Foreign Application Priority Data

Jun. 27, 2016 (KR) .................. 10-2016-0080257

(51) Int. Cl.
*H01L 29/49* (2006.01)
*H01L 27/11582* (2017.01)
*H01L 27/11556* (2017.01)
*H01L 23/528* (2006.01)
*H01L 21/768* (2006.01)
*H01L 27/105* (2006.01)

(52) U.S. Cl.
CPC .. *H01L 27/11582* (2013.01); *H01L 21/76879* (2013.01); *H01L 23/5283* (2013.01); *H01L 27/1052* (2013.01); *H01L 27/11556* (2013.01)

(58) Field of Classification Search
CPC ......... H01L 27/11582; H01L 21/76879; H01L 23/5283; H01L 27/1052; H01L 27/11556
See application file for complete search history.

(56) References Cited

U.S. PATENT DOCUMENTS

| | | | |
|---|---|---|---|
| 2011/0092038 A1* | 4/2011 | Choi | H01L 27/11526 438/268 |
| 2016/0163732 A1* | 6/2016 | Lim | H01L 27/11582 257/314 |
| 2016/0293625 A1* | 10/2016 | Kang | H01L 27/11582 |
| 2017/0011996 A1* | 1/2017 | Lee | H01L 27/1157 |
| 2017/0256551 A1* | 9/2017 | Lee | H01L 27/115 |
| 2017/0263556 A1* | 9/2017 | Tessariol | H01L 23/5283 |

FOREIGN PATENT DOCUMENTS

| KR | 10-2014-0052398 A | 5/2014 |
|---|---|---|
| KR | 10-2014-0063147 A | 5/2014 |

* cited by examiner

*Primary Examiner* — Michael Shingleton
(74) *Attorney, Agent, or Firm* — William Park & Associates Ltd.

(57) ABSTRACT

A semiconductor device may include a first cell structure, a second cell structure, a pad structure, a circuit, and one or more openings. The pad structure may be disposed between the first cell structure and the second cell structure, and may be electrically coupled to the first and second cell structures. The pad structure may have a plurality of stepped structures. The circuit may be disposed under the pad structure. The one or more openings may pass through the pad structure, and may expose the circuit. The one or more openings may be disposed between the plurality of stepped structures.

18 Claims, 22 Drawing Sheets

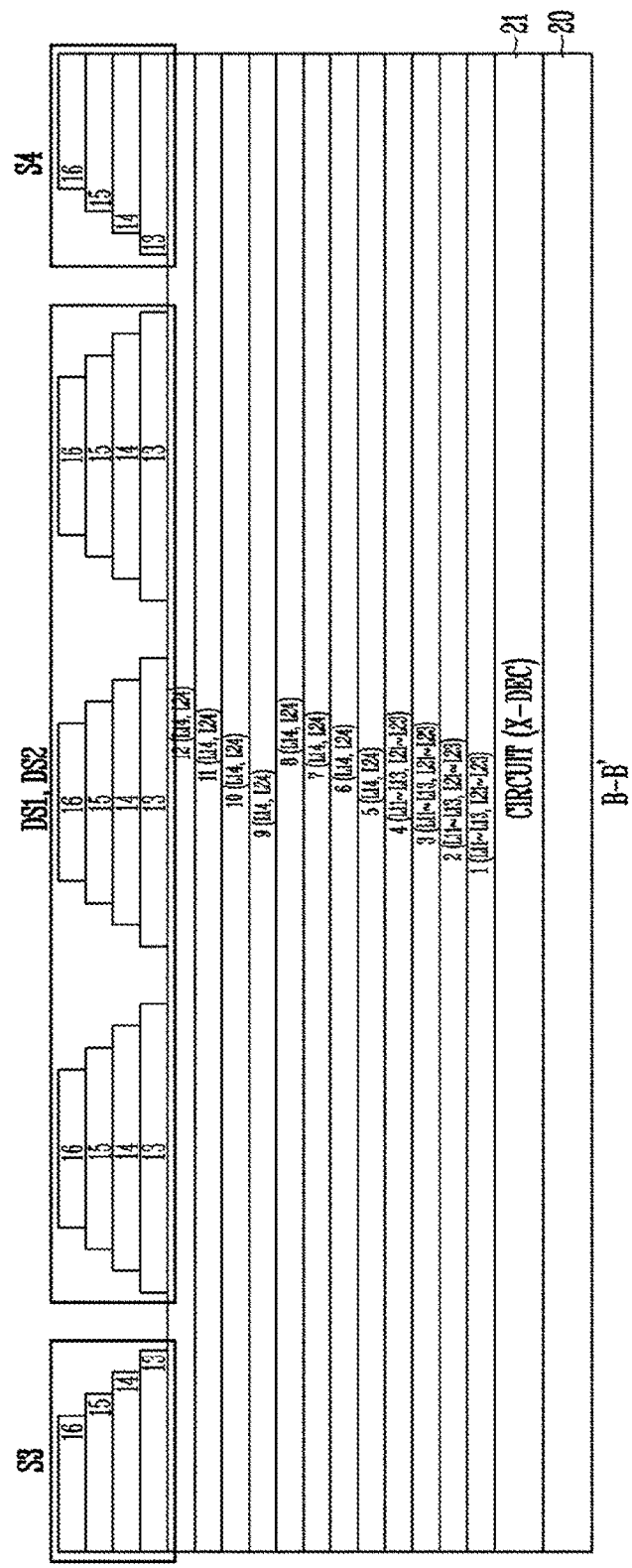

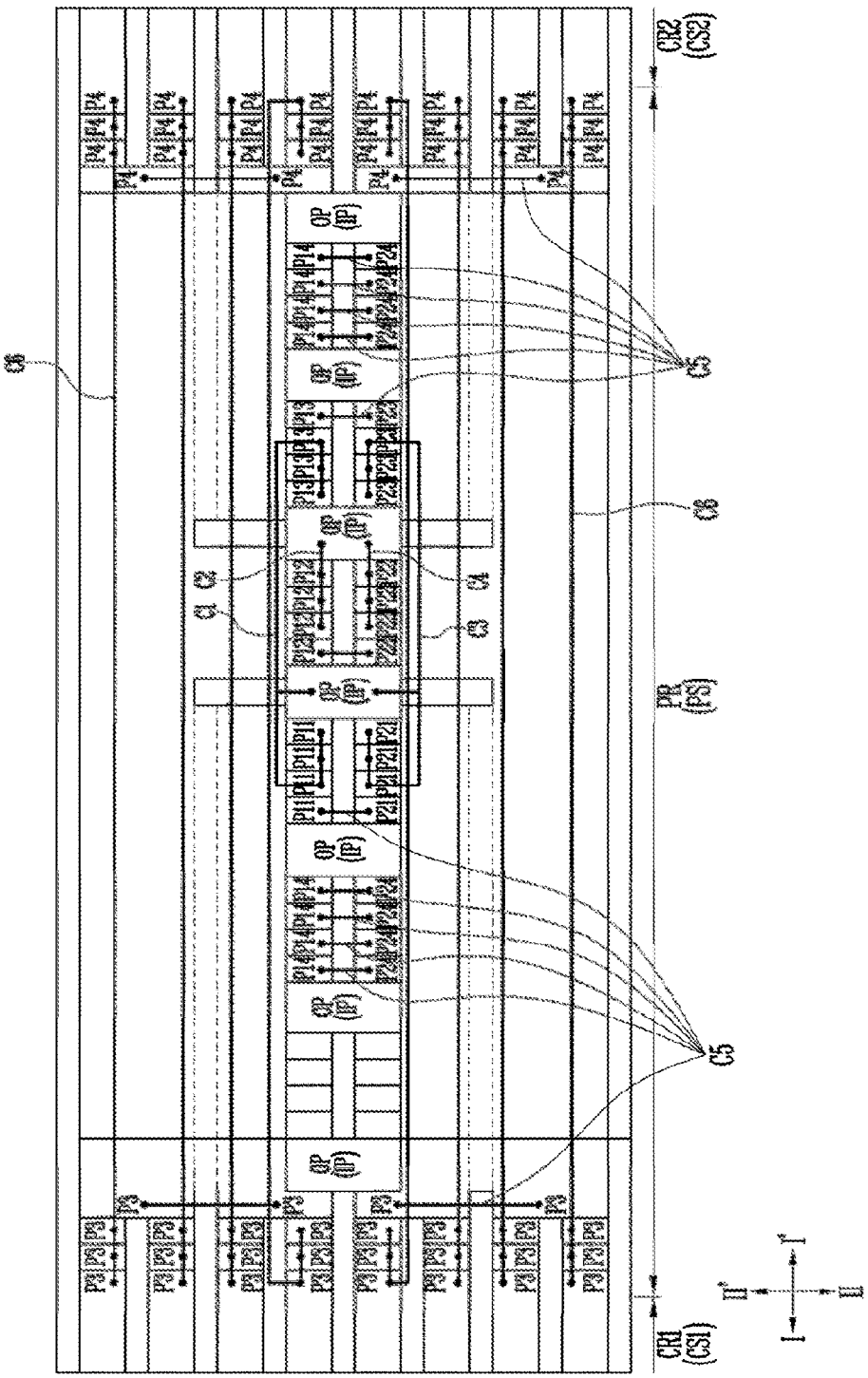

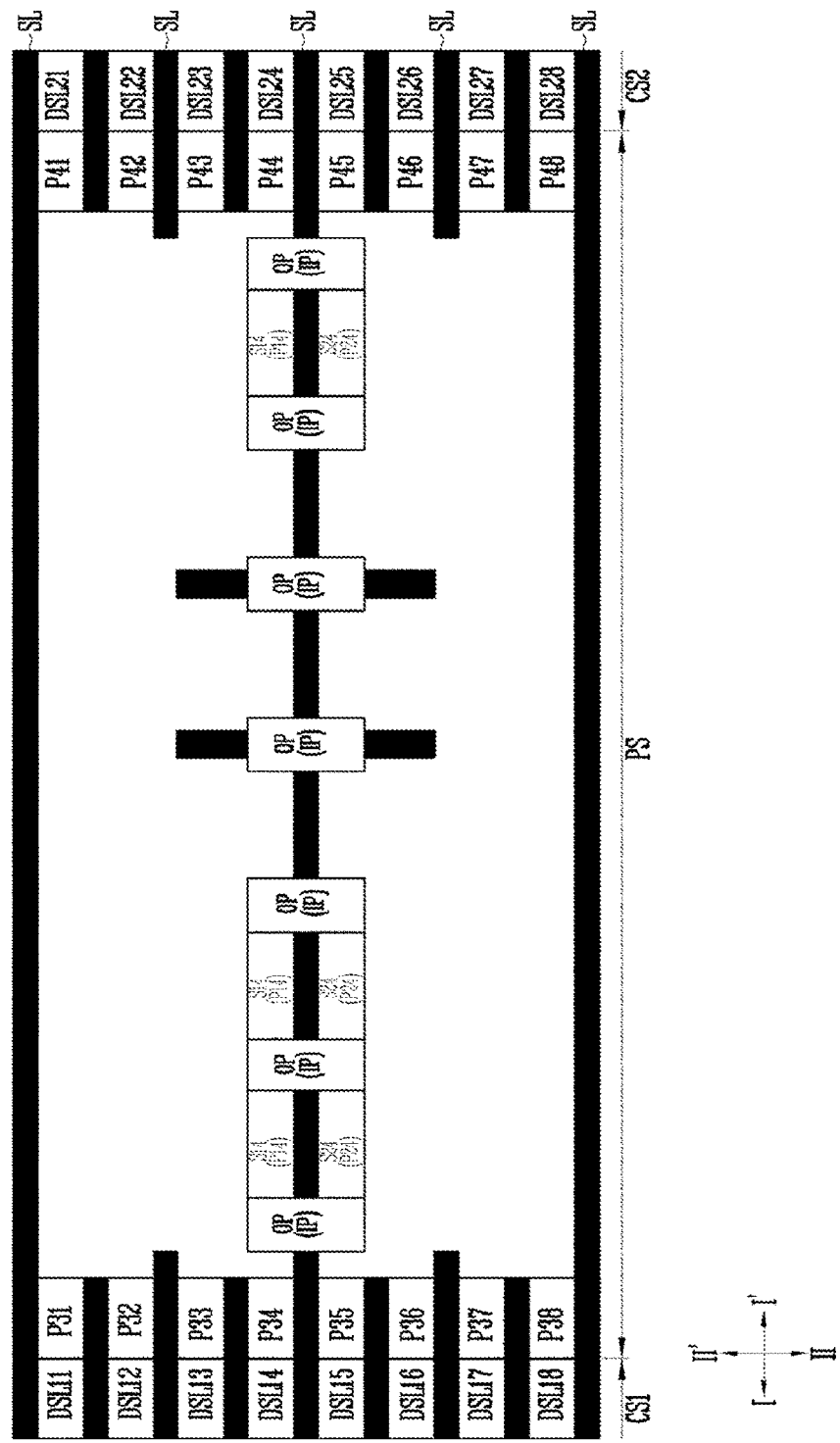

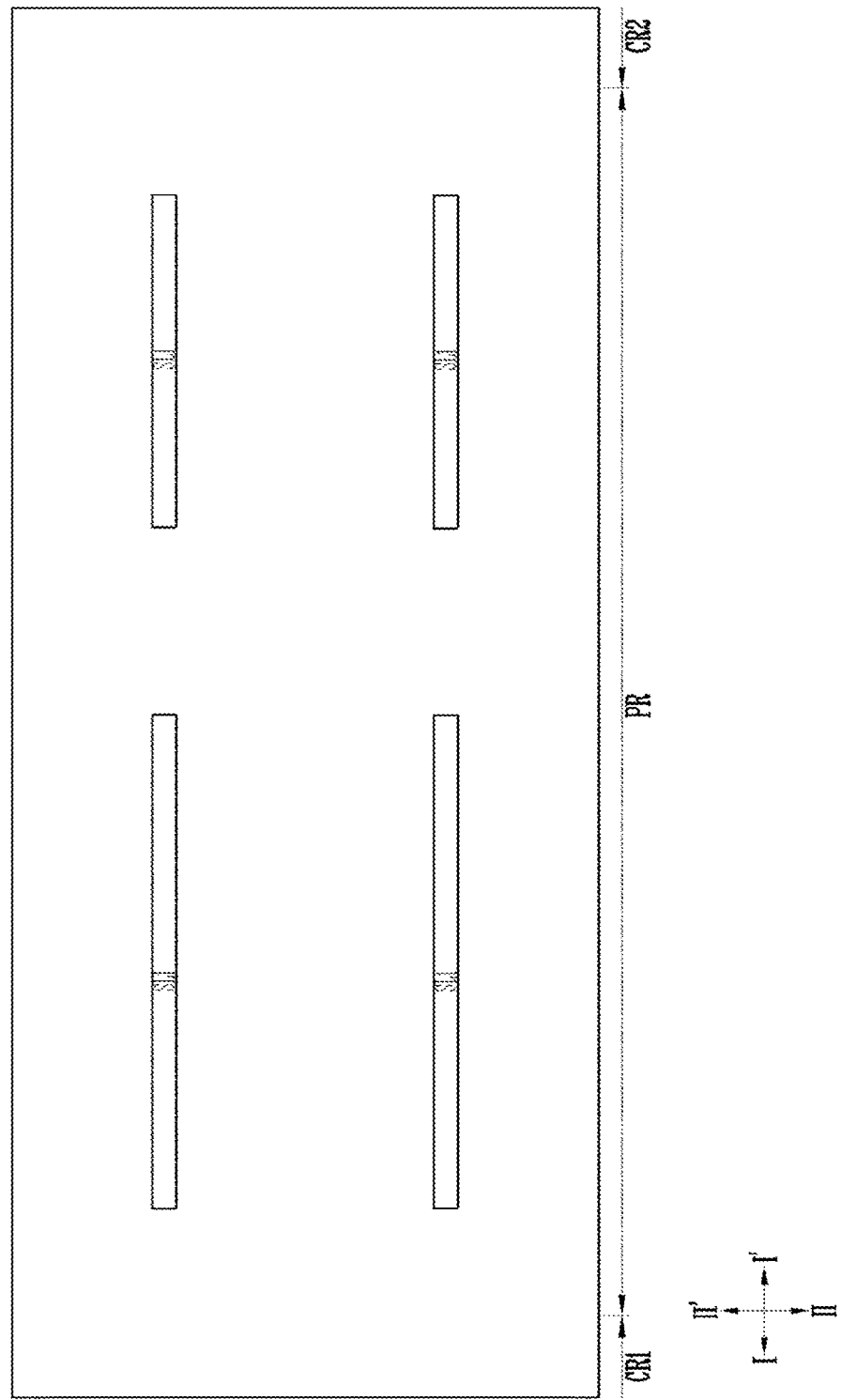

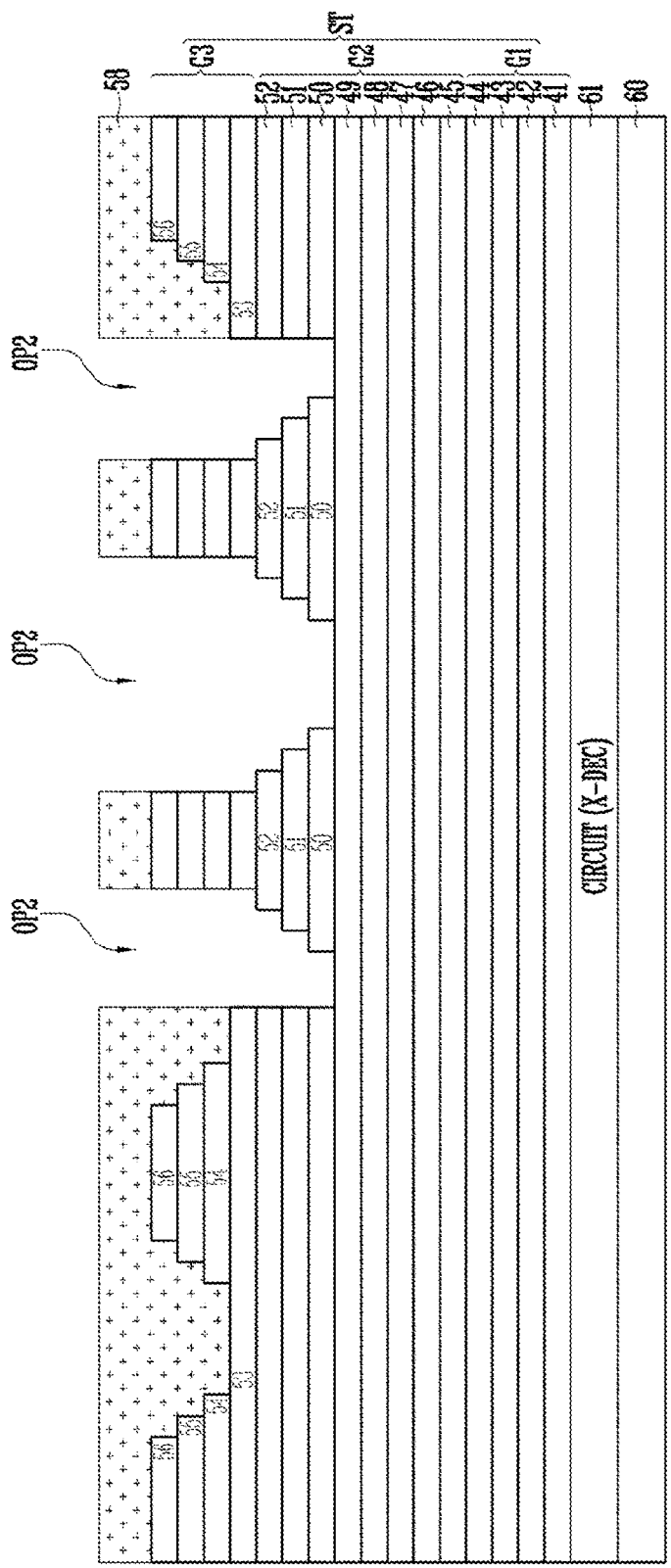

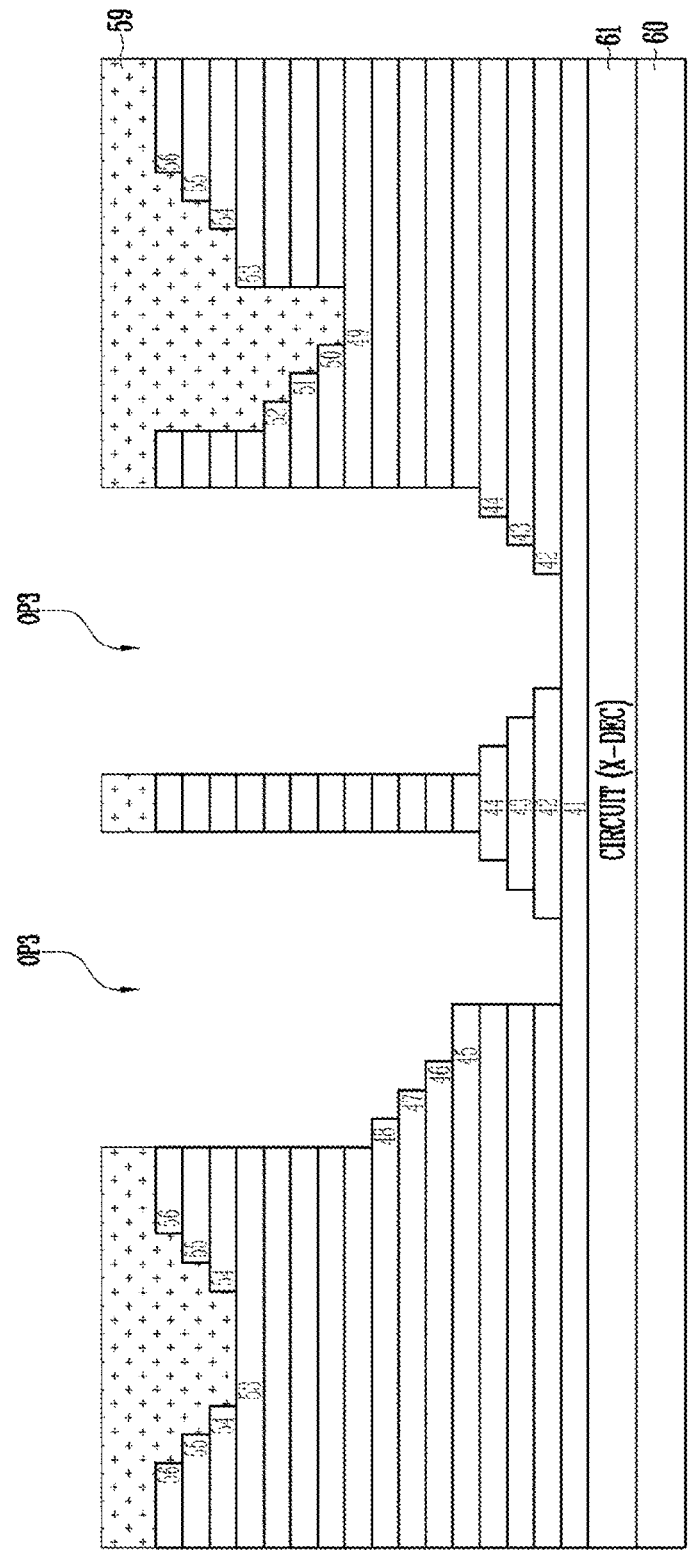

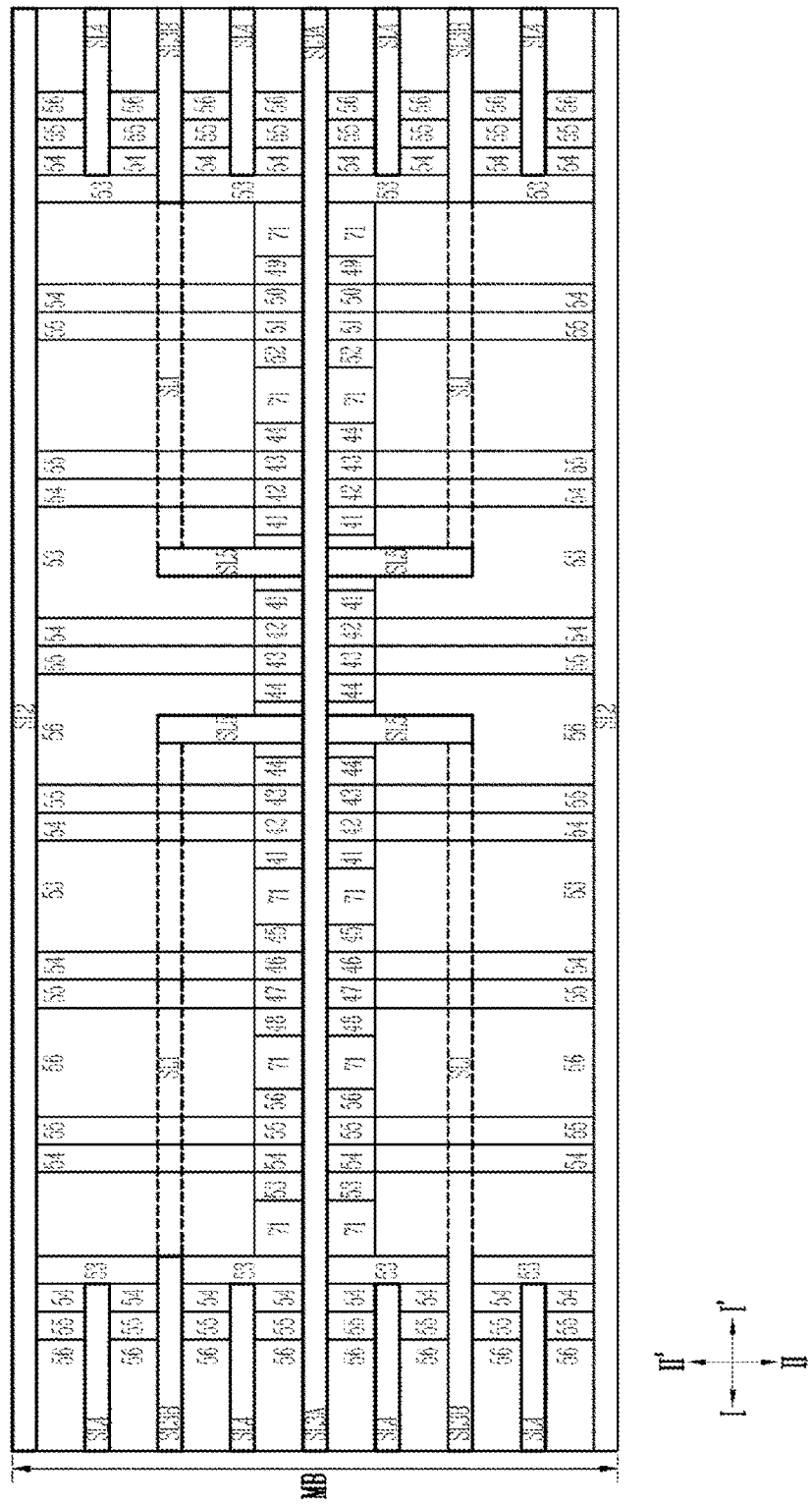

SEMICONDUCTOR DEVICE AND METHOD OF MANUFACTURING THE SAME

CROSS-REFERENCE TO RELATED APPLICATION

The present application claims priority under 35 U.S.C. §119(a) to Korean patent application number 10-2016-0080257 filed on Jun. 27, 2016 in the Korean Intellectual Property Office, the entire disclosure of which is incorporated herein by reference.

BACKGROUND

1. Technical Field

Various embodiments of the present disclosure generally relate to an electronic device and a method of manufacturing the same, and more particularly to a three-dimensional semiconductor device and a method of manufacturing the same.

2. Related Art

Non-volatile memory devices can retain stored data regardless of whether or not they are connected to power supplies. As a two-dimensional non-volatile memory device technology is reaching its physical scaling limit, some semiconductor manufacturers are producing a three-dimensional (3D) non-volatile memory device by stacking memory cells on top of each other on a substrate.

A three-dimensional memory device may include gate electrodes that are stacked alternately with interlayer insulating layers, and may also include channel layers passing through the gate electrodes and interlayer insulating layers. In this way, memory cells may be arranged vertically along the channel layers. To improve reliability of such a non-volatile memory device having a three-dimensional structure, various structures and manufacturing methods are being developed.

SUMMARY

In an embodiment of the present disclosure, a semiconductor device may include a circuit, a pad structure, a first opening, a second opening, a first interconnection structure, and a second interconnection structure. The pad structure may be disposed over the circuit, and may include a first stepped structure including first pads stacked on top of one another, a second stepped structure including second pads stacked on top of one another, and a third stepped structure including third pads stacked on top of one another. The first opening may be disposed between the first stepped structure and the second stepped structure, and may pass through the pad structure and expose the circuit. The second opening may be disposed between the second stepped structure and the third stepped structure, and may pass through the pad structure and expose the circuit. The first interconnection structure may electrically couple the first pads and the third pads to each other and couple the first and third pads in common to the circuit through the first opening or the second opening. The second interconnection structure may electrically couple the second pads to each other and couple the second pads to the circuit through the first opening or the second opening.

In an embodiment of the present disclosure, a semiconductor device may include a first cell structure, a second cell structure, a pad structure, a circuit, and one or more openings. The pad structure may be disposed between the first cell structure and the second cell structure, and may be electrically coupled to the first and second cell structures. The pad structure may have a plurality of stepped structures. The circuit may be disposed under the pad structure. The one or more openings may pass through the pad structure and expose the circuit. The one or more openings may be disposed between the plurality of stepped structures.

In an embodiment of the present disclosure, a method of manufacturing a semiconductor device may include forming a circuit on a pad region of a substrate comprising a first cell region, the pad region and a second cell region which are successively arranged in a first direction. The method may include forming a stacked structure over the substrate on which the circuit is formed, the stacked structure including first to $n^{th}$ (n is a natural greater than or equal to three) groups stacked on top of one another. The method may include partially patterning the pad region of the stacked structure and forming a first cell structure disposed in the first cell region, a second cell structure disposed in the second cell region, and a pad structure disposed in the pad region. The pad structure may include a plurality of stepped structures, and may be electrically coupled to the first and second cell structures. The method may include forming one or more openings passing through the pad structure and exposing the circuit. The one or more openings may be disposed between the plurality of stepped structures.

BRIEF DESCRIPTION OF THE DRAWINGS

FIGS. 1A to 1D are diagrams illustrating an example structure of a semiconductor device according to an embodiment of the present disclosure.

FIGS. 2A and 2B are a layout diagram and a cross-sectional diagram, respectively, illustrating an example structure of a semiconductor device according to an embodiment of the present disclosure.

FIGS. 3A to 3C are layout diagrams illustrating an example structure of a semiconductor device according to an embodiment of the present disclosure.

FIGS. 4A to 8A, 4B to 8B and 9 are layout diagrams and cross-sectional diagrams, respectively, illustrating a method of manufacturing a semiconductor device according to an embodiment of the present disclosure.

DETAILED DESCRIPTION

Figure 1A:
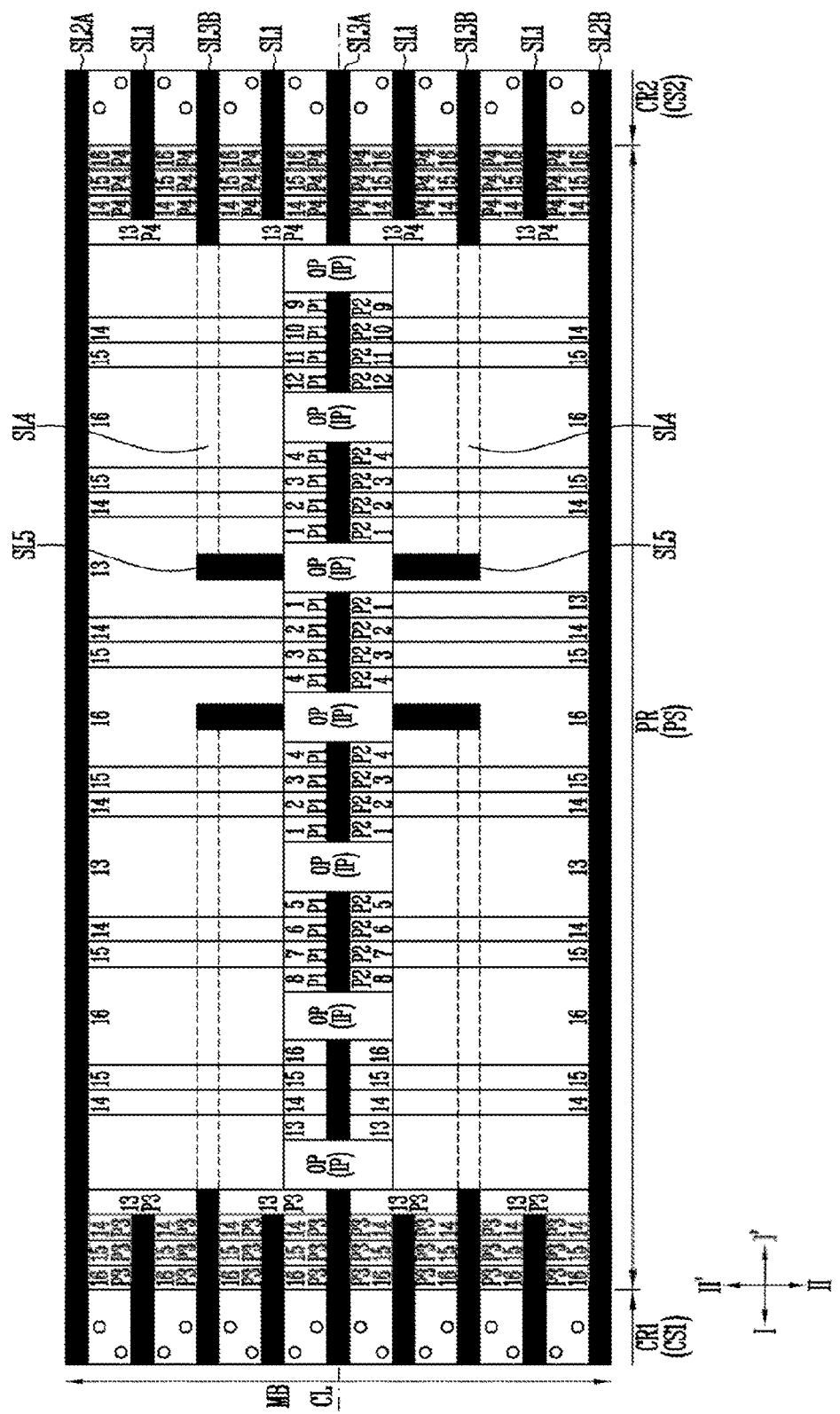

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Hereinafter, various exemplary embodiments will be described in detail with reference to the accompanying drawings. In the drawings, thicknesses and lengths of components may be exaggerated for convenience of illustration. In the following description, a detailed explanation of related functions and constitutions may be omitted for simplicity and conciseness. Like reference numerals refer to like elements throughout the specification and drawings.

Figure 1B:
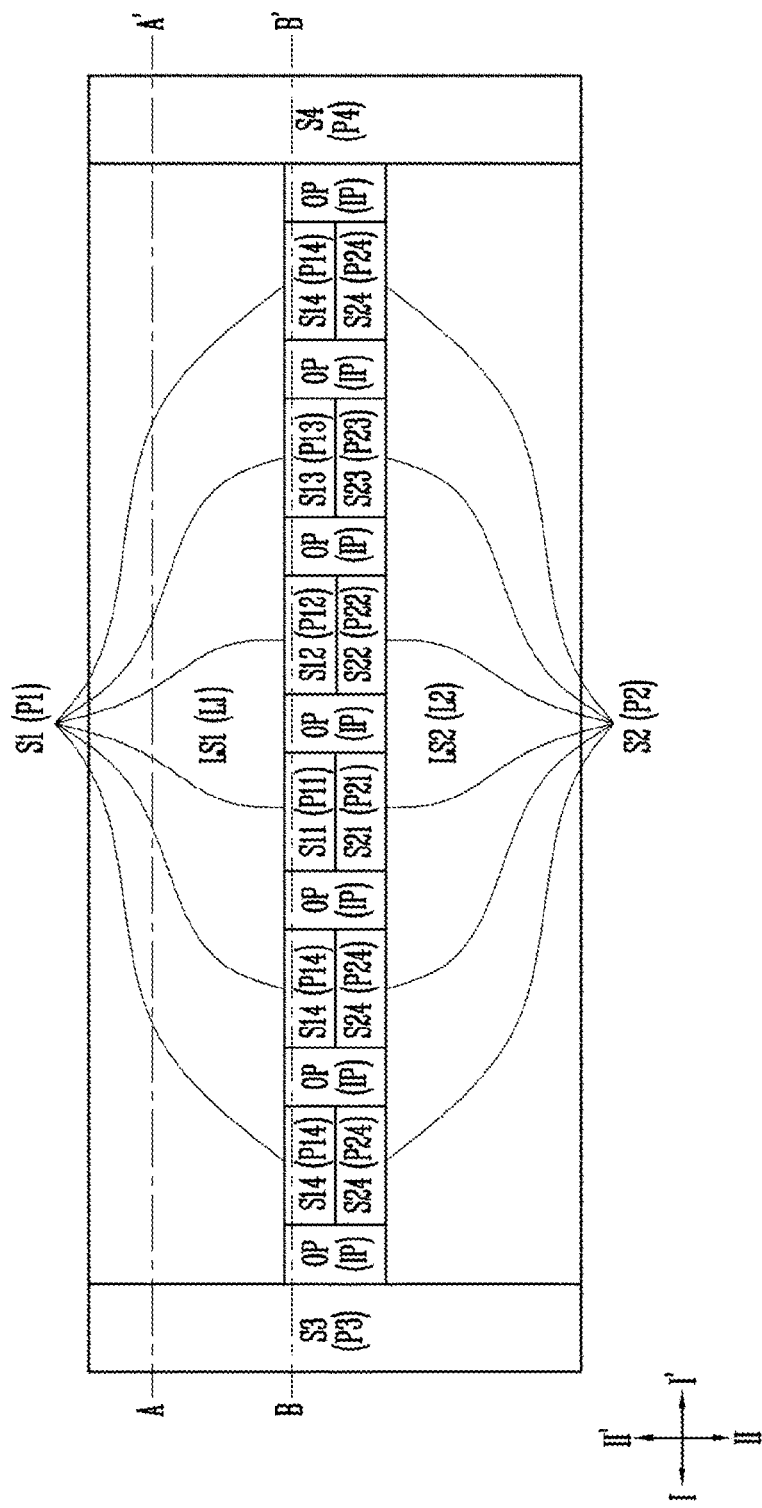
Figure 1C:
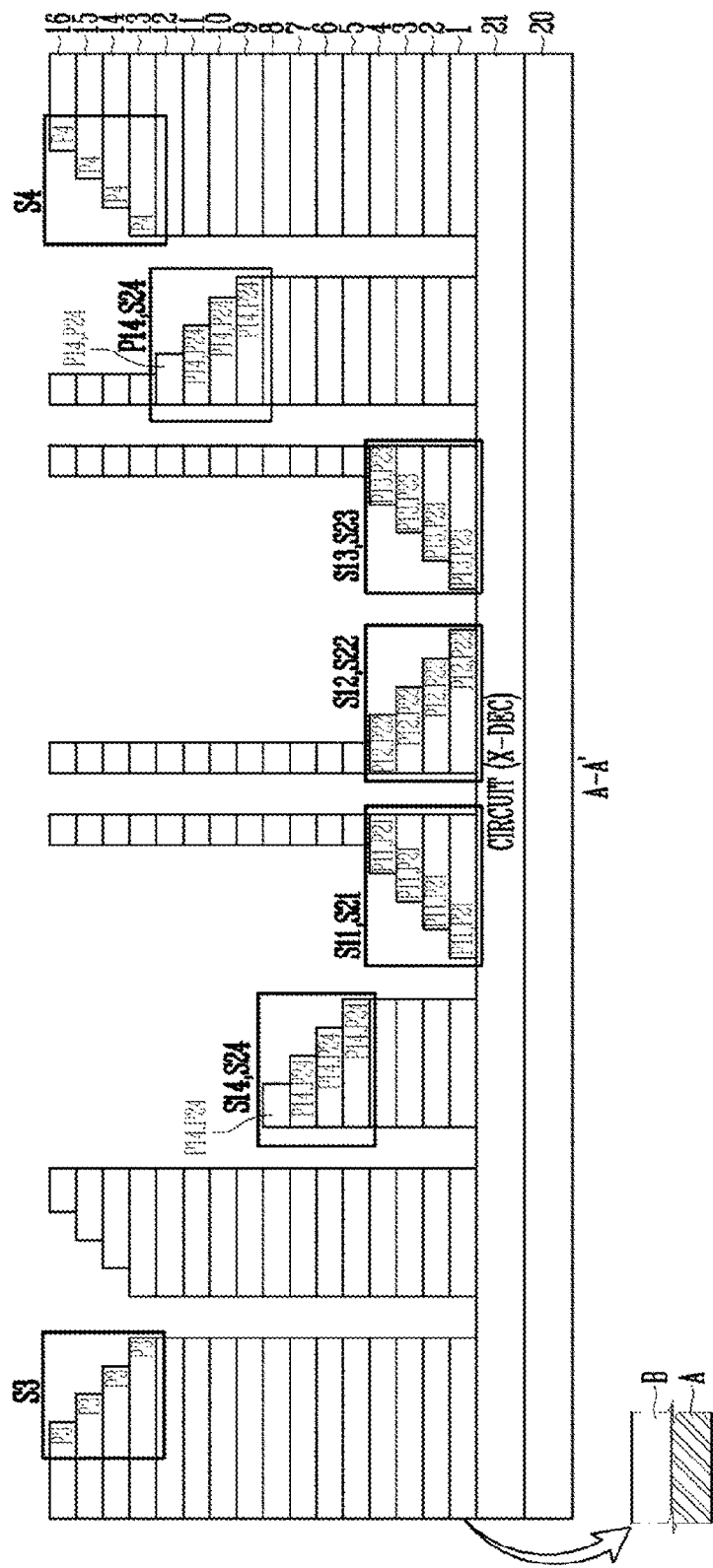

FIGS. 1A to 1D are diagrams illustrating an example structure of a semiconductor device according to an embodiment of the present disclosure. FIGS. 1A and 1B are layout diagrams, FIG. 1C is a cross-sectional view taken along line A-A' of FIG. 1B, and FIG. 1D is a cross-sectional view taken along line B-B' of FIG. 1B.

Referring to FIGS. 1A and 1B, a semiconductor device according to an embodiment may include a substrate, cell structures CS1 and CS2, a pad structure PS, and a circuit. The substrate may include cell regions CR1 and CR2 and a pad region PR. For example, the cell regions CR1 and CR2 may include first and second cell regions CR1 and CR2, and the pad region PR may be located between the first cell region CR1 and the second cell region CR2. Therefore, where the cell structures CS1 and CS2 include first and second cell structures CS1 and CS2, the first cell structure CS1, the pad structure PS and the second cell structure CS2 may be successively arranged in a first direction I-I'. In addition, the semiconductor device may perform an erase operation on a memory block basis. Each of memory blocks MB may include the first cell region CR1, the second cell region CR2, and the pad region PR located between the first cell region CR1 and the second cell region CR2. The first cell structure CR1 and the second cell region CR2 may share the pad structure PS.

The first and second cell structures CS1 and CS2 may be located in the first and second cell regions CR1 and CR2 of the substrate, respectively. The cell structures CS1 and CS2 may include conductive layers and insulating layers, which are alternately stacked on top of each other. To put it another way, each cell structure CS1 and CS2 may have a stacked series of conductive layers interleaved with insulating layers. In addition, the cell structures CS1 and CS2 may include channel layers CH passing the conductive layers and insulating layers. One or more lowermost conductive layers may be used as source select lines. One or more uppermost conductive layers may be used as drain select lines. The other conductive layers may be used as word lines. Here, one or more source select transistors, a plurality of memory cells and one or more drain select transistors that are coupled in series to each other may form a single memory string. The memory string may be disposed in a vertical direction.

The first cell structure CS1 may include one or more first source select lines, a plurality of first word lines and one or more first drain select lines. For example, the plurality of first word lines stacked on top of each other may be disposed on the one or more first source select lines, and the one or more first drain select lines may be disposed on the uppermost first word line. The second cell structure CS2 may include one or more second source select lines, a plurality of second word lines and one or more second drain select lines that are successively stacked on top of one another. For example, the plurality of second word lines stacked on top of each other may be disposed on the one or more second source select lines, and the one or more second drain select lines may be disposed on the uppermost second word line. Furthermore, the first cell structure CS1 may include first vertical memory strings, and the second cell structure CS2 may include second vertical memory strings.

The pad structure PS may be located in the pad region PR of the substrate. For example, the pad structure PS may be located between the first cell structure CS1 and the second cell structure CS2. The pad structure PS may be in direct contact with the first and second cell structures CS1 and CS2, and may be electrically coupled to the first and second cell structures CS1 and CS2. In addition, the circuit may be located under the pad structure PS, and at least a portion of the circuit may be exposed through at least one opening OP passing through the pad structure PS. The opening OP may be filled with an insulating pattern IP. Furthermore, a plurality of openings OP may be arranged in a row along a center line CL, which extends in the first direction I-I' on a central portion of the pad region PR. The openings OP may be located in the central portion of the pad region PR, and the number of openings OP and the shapes thereof may be modified in various ways.

The pad structure PS may include conductive layers and insulating layers which are alternately stacked on top of each other. For example, the pad structure PS may include a stacked series of conductive layers interleaved with insulating layers. Among the conductive layers of the pad structure PS and the conductive layers of the first and second cell structures CS1 and CS2, conductive layers that are disposed on the same level may be electrically coupled to each other. In addition, the pad structure PS is partially patterned to have stepped structures having various heights. In this way, pads P1 to P4 through which biases are individually applied to the corresponding stacked conductive layers may be formed. In addition, the conductive layers of the pad structure PS that are not patterned may function as conductive lines (e.g., interconnects) for electrically coupling the pads P1 to P4 to the conductive layers of the cell structures CS1 and CS2.

The pad structure PS may include first stepped structures S1 and second stepped structures S2. In an embodiment, the first and second stepped structures S1 and S2 may be disposed between every adjacent openings OP. The first and second stepped structures S1 and S2 may be arranged along the center line CL. For example, the first stepped structures S1 may be disposed at one side of the center line CL, and the second stepped structures S2 may be disposed at the other side of the center line CL. In an embodiment, the first stepped structures S1 and the second stepped structures S2 may be symmetrical about the center line CL.

The first stepped structures S1 are arranged in the first direction I-I, and adjacent first stepped structures S1 may be insulated from each other by the corresponding openings OP. The second stepped structures S2 are arranged in the first direction I-I, and adjacent second stepped structures S2 may also be insulated from each other by the corresponding openings OP. Furthermore, adjacent first and second stepped structures S1 and S2 that are arranged symmetrical about the center line CL may be insulated from each other by a third slit SL3A.

The pad structure PS may include a first line structure LS1 and a second line structure LS2. The first line structure LS1 may electrically couple the first pads P1 to the first and second cell structures CS1 and CS2. The second line structure LS2 may electrically couple the second pads P2 to the first and second cell structures CS1 and CS2. The first line structure LS1 may be disposed between the center line CL and a second slit SL2A. The second line structure LS2 may be disposed between the center line CL and a second slit SL2B. In this case, the first line structure LS1, the first stepped structure S1, the second stepped structure S2 and the second line structure LS2 may be successively arranged in the second direction II-II'. In addition, the first line structure LS1, the openings OP and the second line structure LS2 may be successively arranged in the second direction II-II'.

The first line structure LS1 includes first lines L1 which are stacked on top of one another. Each of the first lines L1 electrically couples the first pads P1 to the first cell structure CS1 or the second cell structure CS2. Each of the first lines L1 may electrically couple the first pads P1 to the first and second cell structures CS1 and CS2. The first line structure LS1 has a height equal to or greater than that of the first stepped structure S1. The second line structure LS2 includes second lines L2 which are stacked on top of one another. Each of the second lines L2 electrically couples the second pads P2 to the first cell structure CS1 or the second cell structure CS2. Each of the second lines L2 may electrically couple the second pads P2 to the first and second cell structures CS1 and CS2. The second line structure LS2 has a height equal to or greater than that of the second stepped structure S2. The first line structure LS1 may include a first dummy stepped structure DS1 which is disposed over the stacked first lines L1. The second line structure LS2 may include a second dummy stepped structure DS2 which is disposed over the stacked second lines L2.

The pad structure PS may include a third stepped structure S3, which is in contact with the first cell structure CS1, and a fourth stepped structure S4, which is in contact with the second cell structure CS2. The third stepped structure S3 is disposed between the first cell structure CS1 and the corresponding opening OP, and includes the third pads P3 which are stacked on top of one another. The fourth stepped structure S4 is disposed between the second cell structure CS2 and the corresponding opening OP, and includes the fourth pads P4, which are stacked on top of one another. The third pads P3 may be electrically coupled to the first cell structure CS1. For example, the third pads P3 may be in direct contact with the first cell structure CS1. The fourth pads P4 may be electrically coupled to the second cell structure CS2. For example, the fourth pads P4 may be in direct contact with the second cell structure CS2.

The semiconductor device may include first to fifth slits SL1 to SL5 which pass through the first cell structure CS1, the pad structure PS or the second cell structure CS2 in a stacking direction (e.g., a direction in which layers included in each of the first cell structure CS1, the pad structure PS, and the second cell structure CS2 are stacked). The first to fifth slits SL1 to SL5 may be filled with first to fifth slit insulating layers, respectively. Each of the first to fifth slits SL1 to SL5 may have a depth to completely pass through a corresponding stack structure. Alternatively, each of the first to fifth slits SL1 to SL5 may have a depth that partially penetrates the corresponding stack structure.

The first slits SL1 may separate drain select lines of adjacent channel layers CH from each other, and may be disposed in the memory block MB. Each of the first slits SL1 may pass through the second cell structure CS2 in the stacking direction, and may have a depth to pass through the second drain select line. The first slit SL1 may extend in the first direction I-I' to pass through the fourth stepped structure S4. The first slit SL1 may insulate fourth pads P4 coupled to the second drain select line, from each other. Also, the first slit SL1 may be disposed to pass through the first cell structure CS1 and the third stepped structure S3.

The second slits SL2A and SL2B may electrically separate adjacent memory blocks MB, and may be disposed on boundaries between the adjacent memory blocks MB. Each of the second slits SL2A and SL2B may have a depth to completely pass through the first and second cell structures CS1 and CS2 and the pad structure PS in the stacking direction.

The third slits SL3A and SL3B are disposed in the memory block MB, and each have a line shape extending in the first direction I-I'. Each of the third slits SL3A and SL3B may have a depth to completely pass through the first and second cell structures CS1 and CS2 in the stacking direction. The third slit SL3A may extend to the pad region PR and overlap with the center line CL. The third slit SL3A may traverse the plurality of openings OP, and may be interposed between adjacent first and second stepped structure S1 and S2. Therefore, the adjacent first and second stepped structure S1 and S2 may be insulated from each other by the third slit SL3A. The third slits SL3B may be disposed between the center line CL and the second slits SL2A and SL2B, and each may have a depth to pass through the first cell structure CS2 and the third stepped structure S3 or the second cell structure CS2 and the fourth stepped structure S4.

The fourth and fifth slits SL4 and SL5 insulate conductive lines disposed at the same level from each other. The fourth and fifth slits SL4 and SL5 may be disposed in the pad structure PS. The fourth slits SL4 may extend in the first direction I-I', and may be coupled to the third slits SL3B. The fifth slits SL5 may extend in the second direction II-II', and may traverse the corresponding openings OP. The fifth slits SL5 may be coupled to the fourth slits SL4. Accordingly, the fourth and fifth slits SL4 and SL5 may be coupled to each other in a C shape.

Each of the fourth slits SL4 may have a depth to pass through only the lines that are coupled to the source select lines. Each of the fifth slits SL5 may have a depth to completely pass through the pad structure PS. The lines coupled to the source select lines are patterned by the second slits SL2A and SL2B, the third slit SL3A, the fourth slit SL4 and the fifth slits SL5. The lines that coupled to the word lines are patterned by the second slits SL2A and SL2B, the third slit SL3A and the fifth slits SL5. As such, the source select lines and the word lines may be patterned in different shapes by adjusting the depths of the fourth slits SL4.

Referring to FIGS. 1C and 1D, the pad structure PS may be disposed in the pad region PR of the substrate 20, and a circuit 21 may be disposed under the pad structure PS. The circuit 21 may include a variety of components, such as a transistor, a capacitor, and a resistor. In an embodiment, the circuit 21 may be an X-decoder X-DEC. The pad structure PS may include stacked layers 1 to 16, and each of the layers 1 to 16 may include a first layer A and a second layer B. For example, the first layer A may be a conductive layer, and the second layer B may be an insulating layer. Alternatively, the first layer A may be an insulating layer, and the second layer B may be a conductive layer.

Each of the first stepped structures S11 to S13 includes first pads P11 to P13. The first pads P11 to P13 are electrically coupled to the first lines L11 to L13, respectively. The first lines L11 to L13 electrically couple the first pads P11 to P13 to the first source select lines of the first vertical memory strings and/or the second source select lines of the second vertical memory strings.

Each of the first stepped structures S14 includes first pads P14. The first pads P14 are electrically coupled to the first lines L14, respectively. The first lines L14 electrically couple the first pads P14 to the first word lines of the first vertical memory strings and the second word lines of the second vertical memory strings.

The first stepped structures S11 to S14 and the second stepped structures S21 to S24 may be arranged symmetrically about the center line CL. The first lines L11 to L14 and the second lines L21 to L24 may be arranged symmetrically about the center line CL.

The third stepped structure S3 may include the third pads P3 electrically coupled to the first drain select lines of the first vertical memory strings. The fourth stepped structure S4 may include the fourth pads P4 electrically coupled to the second drain select lines of the second vertical memory strings. For reference, the third pad P3 of the thirteenth layer 13 may be electrically coupled to the first word line of the first vertical memory string, and the fourth pad P4 of the thirteenth layer 13 may be electrically coupled to the second word line of the second vertical memory string.

Here, the first cell structure CS1 and the second cell structure CS2 are disposed on opposite sides of the pad structure PS. The first cell structure CS1 and the second cell structure CS2 may share the pad structure PS. Therefore, compared to the case where a circuit is disposed on only one side of the cell region, the distance between the circuit 21 and the cell structures CS1 and CS2 may be reduced by half, and thus the RC delay may be reduced. Therefore, a program speed of the semiconductor device may be increased.

Furthermore, the circuit 21 and the plurality of openings OP may be disposed in the central portion of the pad region PR, and the pads are distributed in spaces between the plurality of openings OP. Thus, the pad area PR requires a smaller area. In addition, because the pads are formed by partially patterning the pad structure and non-patterned regions are used as conductive lines (e.g., interconnects), the manufacturing process can be simplified.

Figure 2B:
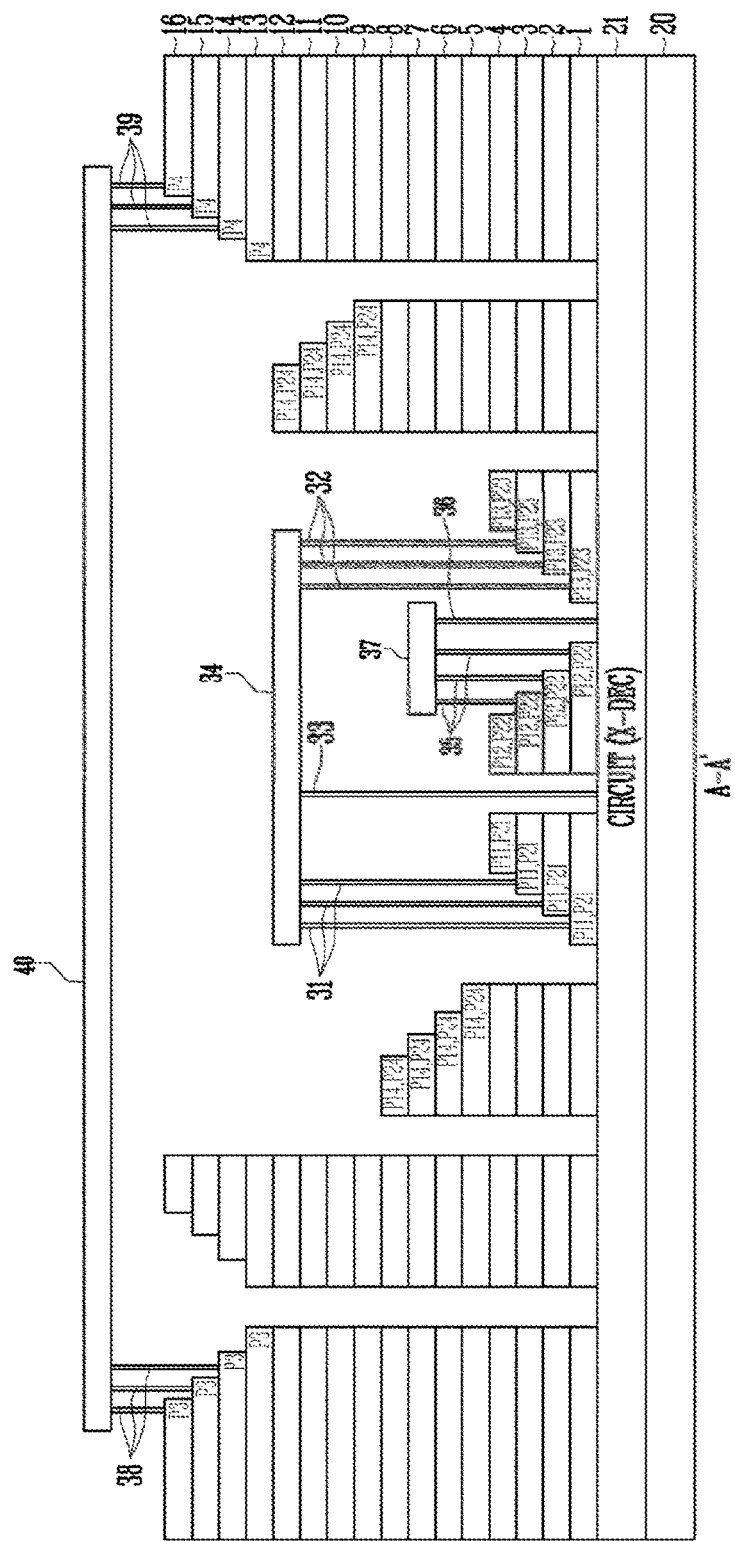

FIGS. 2A and 2B are diagrams illustrating an example structure of a semiconductor device according to an embodiment of the present disclosure. FIG. 2A is a layout view of an interconnection structure, and FIG. 2B is a cross-sectional view of a first stepped structure, taken along a line in the first direction I-I'. The same or like elements in FIGS. 2A and 2B are labeled with the same reference characters as those in FIGS. 1A to 1D, and any repetitive detailed description will be omitted or simplified.

Referring to FIGS. 2A and 2B, a first interconnection structure C1 may electrically couple first pads P11 of the first stepped structure S11 to first pads P13 of the first stepped structure S13. Furthermore, the first interconnection structure C1 may couple the first pads P11 and P13 to the circuit 21. For example, the first interconnection structure C1 may include first contact plugs 31 coupled to the respective first pads P11, second contact plugs 32 coupled to the respective first pads P13, a third contact plug 33 disposed in the corresponding opening OP and coupled to the circuit 21, and a conductive line 34 which electrically couples the first to third contact plugs 31 to 33 to each other and extends in the first direction I-I'.

A second interconnection structure C2 may electrically couple first pads P12 of the first stepped structure S12 to each other, and may couple the first pads P12 to the circuit 21. For example, the second interconnection structure C2 may include first contact plugs 35 coupled to the respective first pads P12, a second contact plug 36 disposed in the corresponding opening OP and coupled to the circuit 21, and a conductive line 37 which electrically couples the first to third contact plugs 35 to 36 to each other and extends in the first direction I-I'.

A third interconnection structure C3 may electrically couple second pads P21 of the second stepped structure S21 to second pads P23 of a second stepped structure S23 and to the electrically-coupled first and second pads P21 and P23 to the circuit 21. A fourth interconnection structure C4 may couple second pads P22 of the second stepped structure S22 to the circuit.

A fifth interconnection structure C5 may electrically couple first pads P14 of the first stepped structures S14 and second pads P24 of the second stepped structure S24, which are adjacent to each other in the second direction II-II', to each other. Among the first and second pads P14 and P24, a first pad P14 and a second pad P24 that are disposed at the same level are electrically coupled to each other.

A sixth interconnection structure C6 may electrically couple third pads P3 of the third stepped structure S3 to fourth pads P4 of the fourth stepped structure S4. For example, the sixth interconnection structure C6 may include fourth contact plugs 38 coupled to the respective third pads P3, fifth contact plugs 39 coupled to the respective fourth pads P4, and a conductive line 40 which electrically couples the fourth and fifth contact plugs 38 and 39 to each other.

For reference, depending on the respective numbers of source select transistors, memory cells and drain select transistors included in a single memory string, the coupling methods may be modified. In an example, a vertical memory string illustrated in FIGS. 2A and 2B includes three source select transistors, ten memory cells and three drain select transistors. Therefore, a first pad P11 of a fourth layer 4 of the first stepped structure S11 may be electrically coupled to a second pad P21 of a fourth layer 4 of the second stepped structure S21 by the fifth interconnection structure C5. Furthermore, third pads P3 of thirteenth layers 13 of the third stepped structures S3 adjacent to each other in the second direction II-II' may be electrically coupled to each other by the fifth interconnection structure C5. Although FIGS. 2A and 2B illustrates an example of a vertical memory string as including three source select transistors, ten memory cells and three drain select transistors, it is intended to be illustrative only and the invention is not limited thereto, and the number of stacked layers or the coupling methods of the interconnection structures may vary.

Figure 3A:
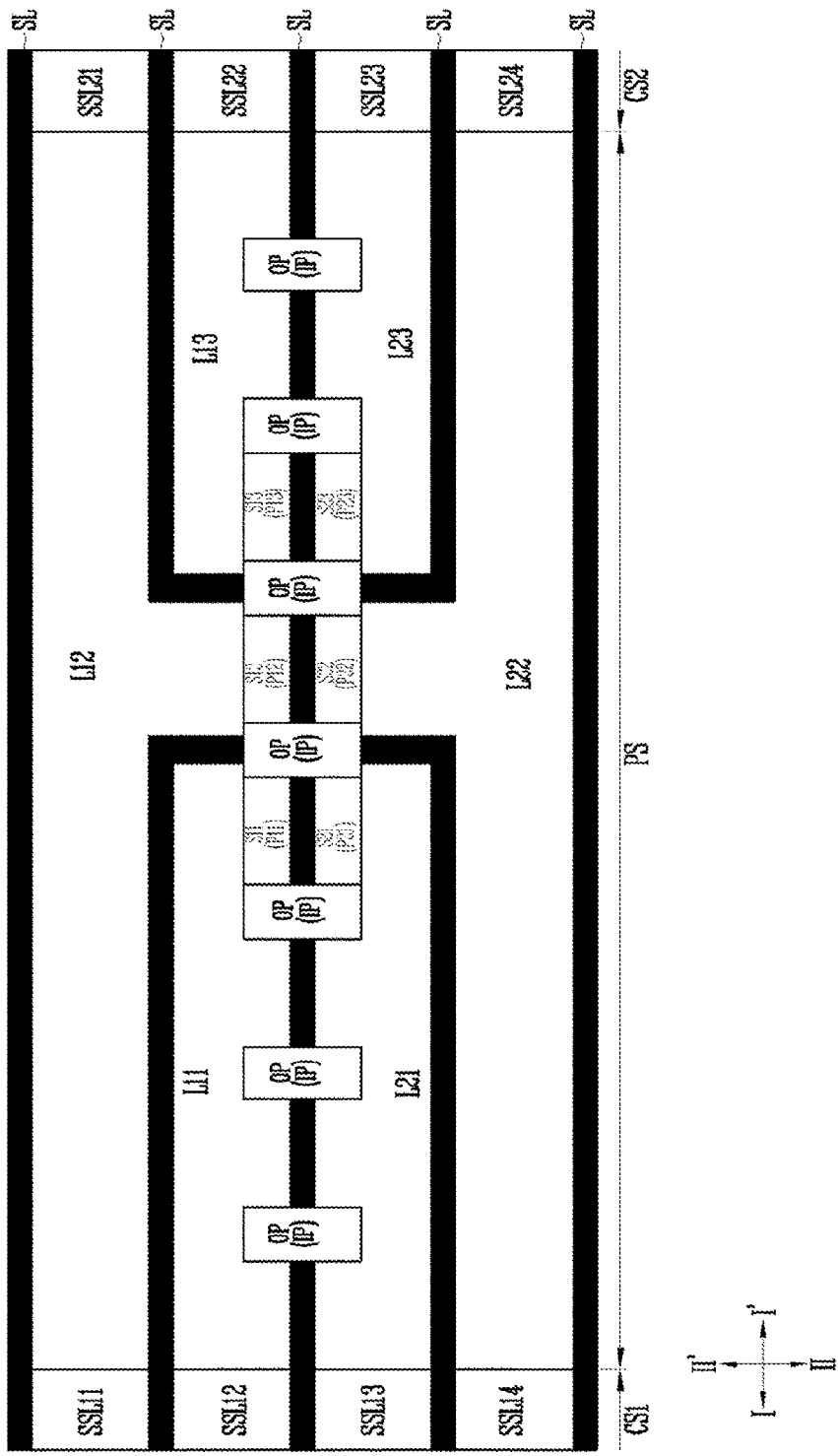
Figure 3B:
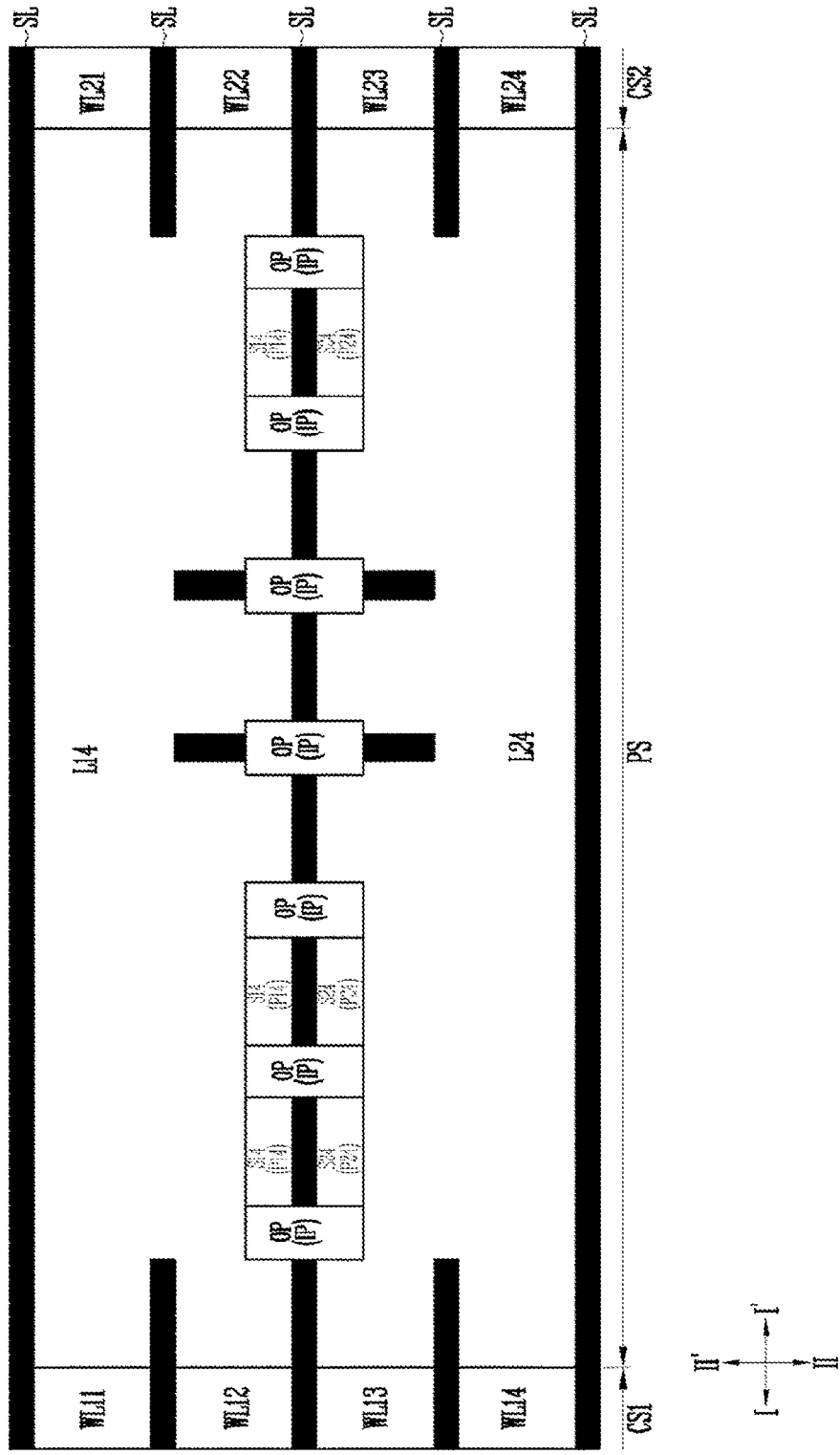

FIGS. 3A to 3C are layout diagrams illustrating an example structure of a semiconductor device according to an embodiment of the present disclosure. FIG. 3A is a layout diagram showing conductive lines and pads coupled to source select lines. FIG. 3B is a layout diagram showing conductive lines and pads coupled to word lines. FIG. 3C is a layout diagram showing pads coupled to drain select lines.

Referring to FIG. 3A, the first cell structure CS1 includes first source select lines SSL11 to SSL14, and the second cell structure CS2 includes second source select lines SSL21 to SSL24. First and second pads P11 to P13 and P21 to P23 of the pad structure PS are electrically coupled to the first and second source select lines SSL11 to SSL14 and SSL21 to SSL24.

The first pads P11 are electrically coupled to a first line L11. The first pads P12 are electrically coupled to a first line L12. The first pads P13 are electrically coupled to a first line L13. The first lines L11 to L13 disposed at the same level are insulated from each other by slits SL.

The first line L11 electrically couples the first source select line SSL12 to the first pads P11. The first line L12 is coupled in common to the first source select line SSL11 and the second source select line SSL21. Thus, the first line L12 electrically couples the first and second source select lines SSL11 and SSL21 to the first pads P12. The first line L13 electrically couples the second source select line 55L22 to the first pads P13.

The second pads P21 are electrically coupled to a second line L21. The second pads P22 are electrically coupled to a second line L22. The second pads P23 are electrically coupled to a second line L23. The second lines L21 to L23 disposed at the same level are insulated from each other by slits SL.

The second line L21 electrically couples the first source select line SSL13 to the second pads P21. The second line L22 is coupled in common to the first source select line SSL14 and the second source select line SSL24. Thus, the second line L22 electrically couples the first and second source select lines SSL14 and SSL24 to the second pads P22. The second line L23 electrically couples the second source select line SSL23 to the second pads P23.

Therefore, the first source select lines SSL11 to SSL14 included in the first cell structure CS1 may be individually controlled. Furthermore, the second source select lines SSL21 to SSL24 included in the second cell structure CS2 may be individually controlled.

Referring to FIG. 3B, the first cell structure CS1 includes first word lines WL11 to WL14, and the second cell structure CS2 includes second word lines WL21 to WL24. The first and second pads P14 and P24 of the pad structure PS are electrically coupled to the first and second word lines WL11 to WL14 and WL21 to WL24.

The first pads P14 are electrically coupled to first lines L14, and the second pads P24 are electrically coupled to second lines L24. Among the first lines L14 and the second lines L24, a first line L14 and a second line L24 disposed at the same level are insulated from each other by a slit SL.

The first line L14 is coupled in common to the first word lines WL11 to WL12 and the second word lines WL21 to WL22. Thus, the first line L14 electrically couples the first and second word lines WL11 to WL12 and WL21 to WL22 to the first pads P14. The second line L24 is coupled in common to the first word lines WL13 to WL14 and the second word lines WL23 to WL24. Thus, the second line L24 electrically couples the first and second word lines WL13 to WL14 and WL23 to WL24 to the second pads P24.

Referring to FIG. 3C, the first cell structure CS1 includes first drain select lines DSS11 to DSL18, and the second cell structure CS2 includes second drain select lines DSL21 to DSL28. Furthermore, third pads P31 to P38 of the pad structure PS are electrically coupled to the first drain select lines DSL11 to DSL18, respectively. Fourth pads P41 to P48 are electrically coupled to the second drain select lines DSL21 to DSL 28, respectively. The third pads P31 to P38 may be in direct contact with the first drain select lines DSL11 to DSL18, respectively. The fourth pads P41 to P48 may be in direct contact with the second drain select lines DSL21 to DSL28, respectively.

FIGS. 4A to 9 are layout diagrams and cross-sectional diagrams illustrating a method of manufacturing a semiconductor device according to an embodiment of the present disclosure. FIGS. 4A, 5A, 6A, 7A, 8A, and 9 are layout diagrams, and FIGS. 4B, 5B, 6B, 7B, and 8B are cross-sectional views. The same or like elements in FIGS. 4A to 9 are labeled with the same reference characters as those in previous drawings, and any repetitive detailed description will be omitted or simplified.

Figure 4B:
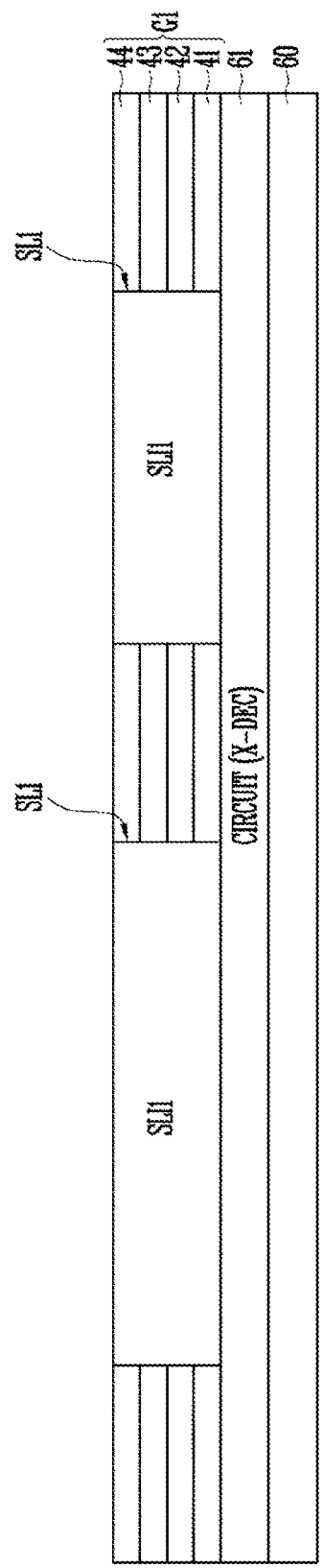

Referring to FIGS. 4A and 4B, a circuit 61 is formed on the substrate 60 including the first cell region CR1, the second cell region CR2 and the pad region PR. For example, an X-decoder is formed on the pad region PR of the substrate 60, and then an interlayer insulating layer is formed. Subsequently, stacked layers 41 to 44 are formed on the substrate 60. The stacked layers 41 to 44 are formed on the first cell region CR1, the pad region PR and the second cell region CR2 of the substrate 60 in a manner that covers the circuit 61.

Thereafter, although not illustrated, channel layers, which pass through the stacked layers 41 to 44 of the first and second cell regions CR1 and CR2, and data storage layers, which enclose the sidewalls of the respective channel layers, may be formed. Each of the data storage layers may include a floating gate containing materials such as silicon, charge trap material (e.g., nitrides), phase change material, nanodots, and so forth.

Thereafter, first slits SL1 passing through the stacked layers 41 to 44 are formed, and first slit insulating layers SLI1 are formed in the first slits SL1. The first slits SL1 may be disposed in the pad region PR. Each first slit SL1 may have a line shape extending in the first direction I-I'. The first slits SL1 pass through the stacked layers 41 to 44 in the stacking direction (e.g., a direction in which the layers 41 to 44 are stacked). The first slits SL1 may be spaced apart from each other. The first slits SL1 may have the same length as each other. Alternatively, the first slits SL1 may have different lengths.

For instance, in forming a stack structure in which n groups are stacked, a first group G1 is formed, and then the first slit SL1 and the first slit insulating layer SLI1 are formed. In this way, the first group G1 may have a pattern different from that of the remaining second to $n^{th}$ groups. Here, n is a natural number greater than or equal to three.

Figure 5A:
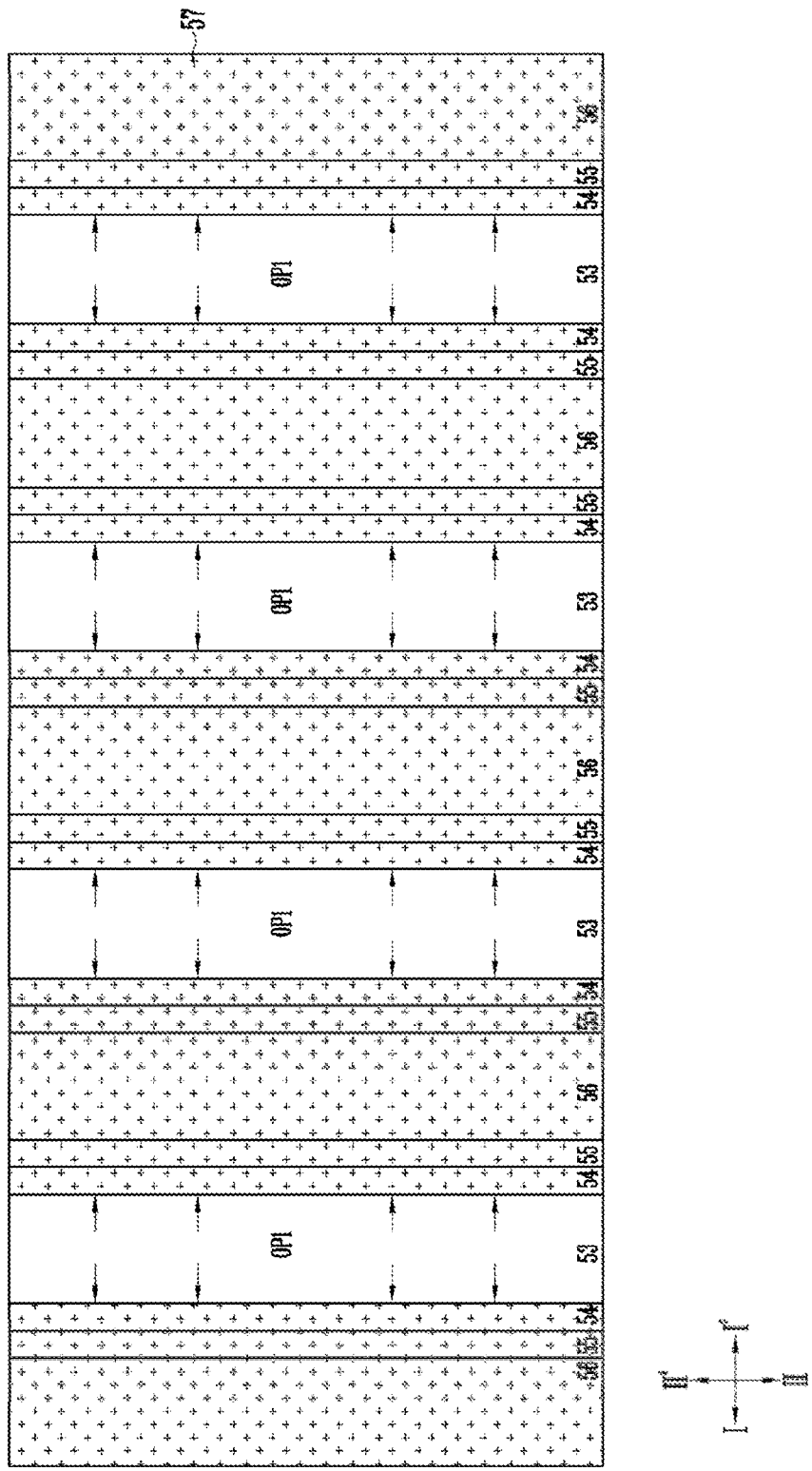
Figure 5B:
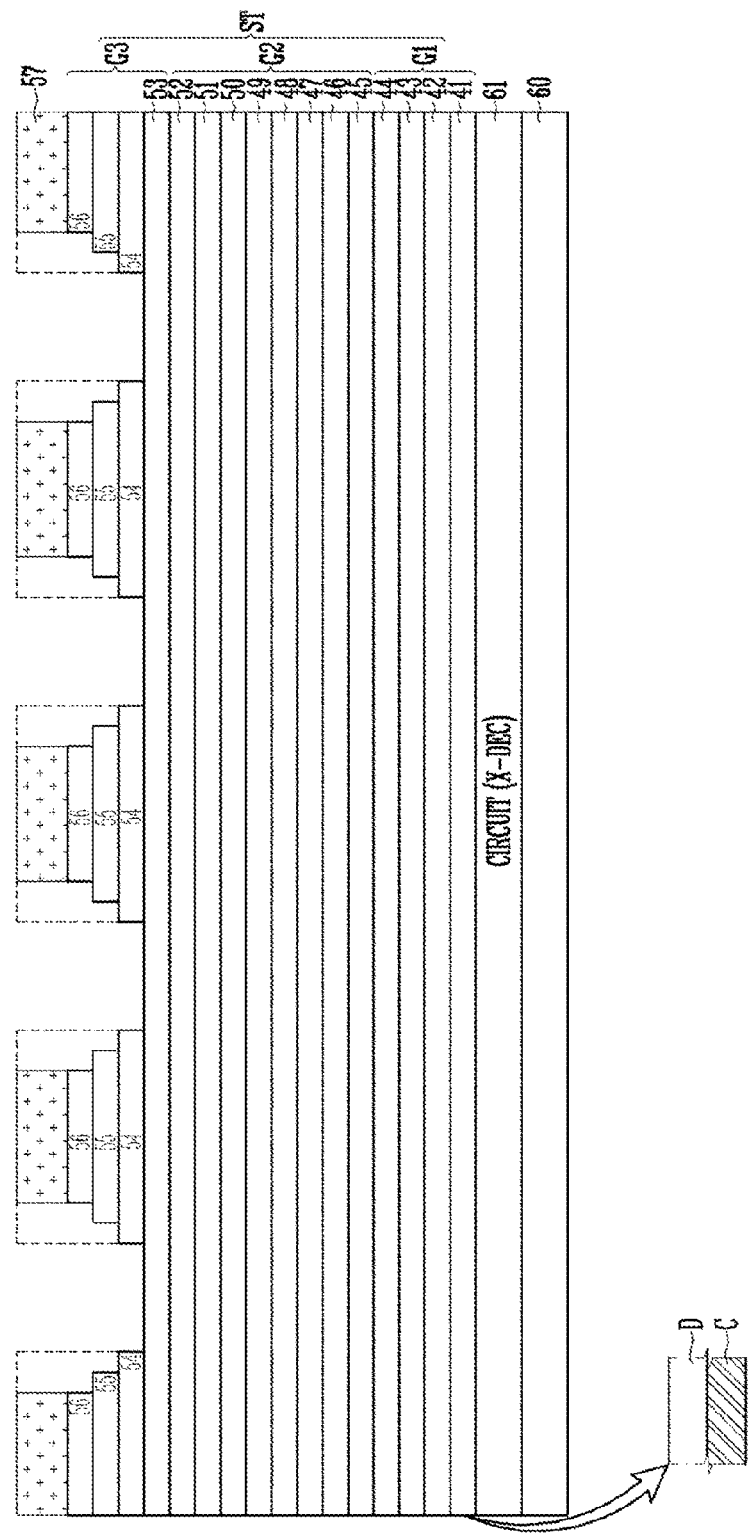
Figure 6A:
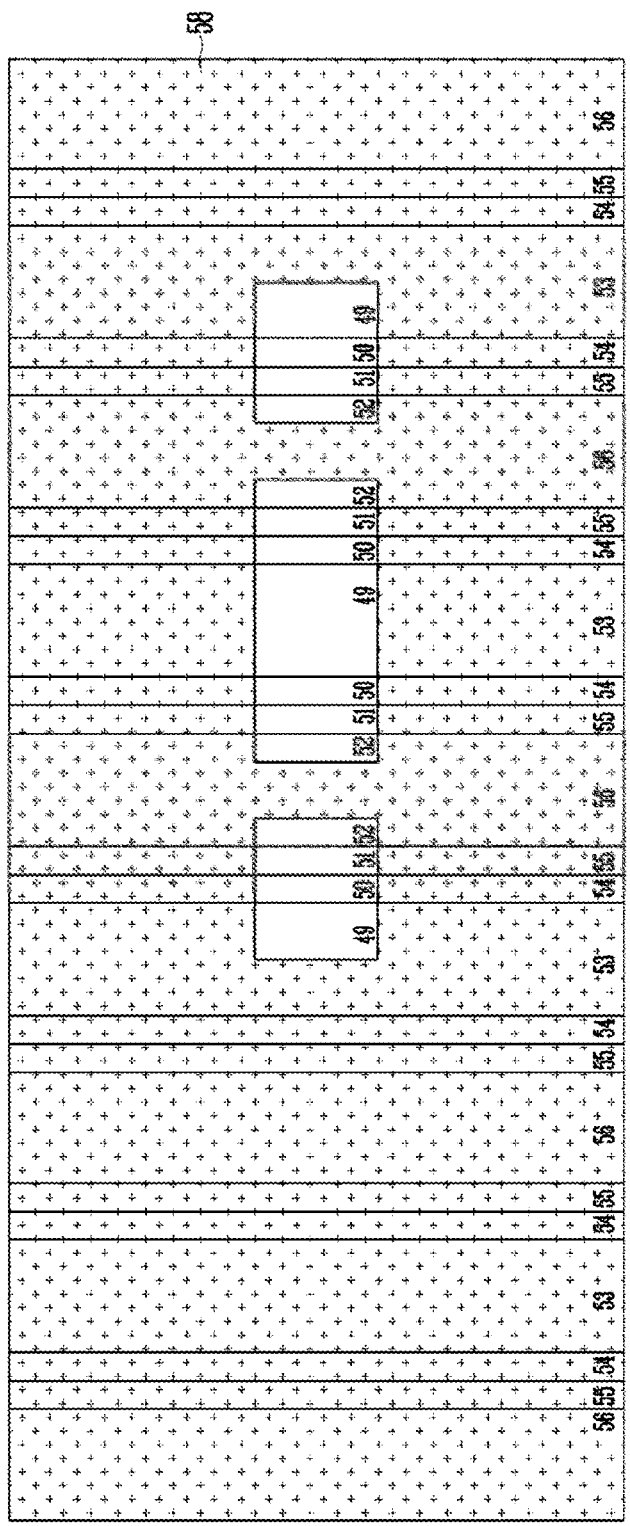
Figure 7A:
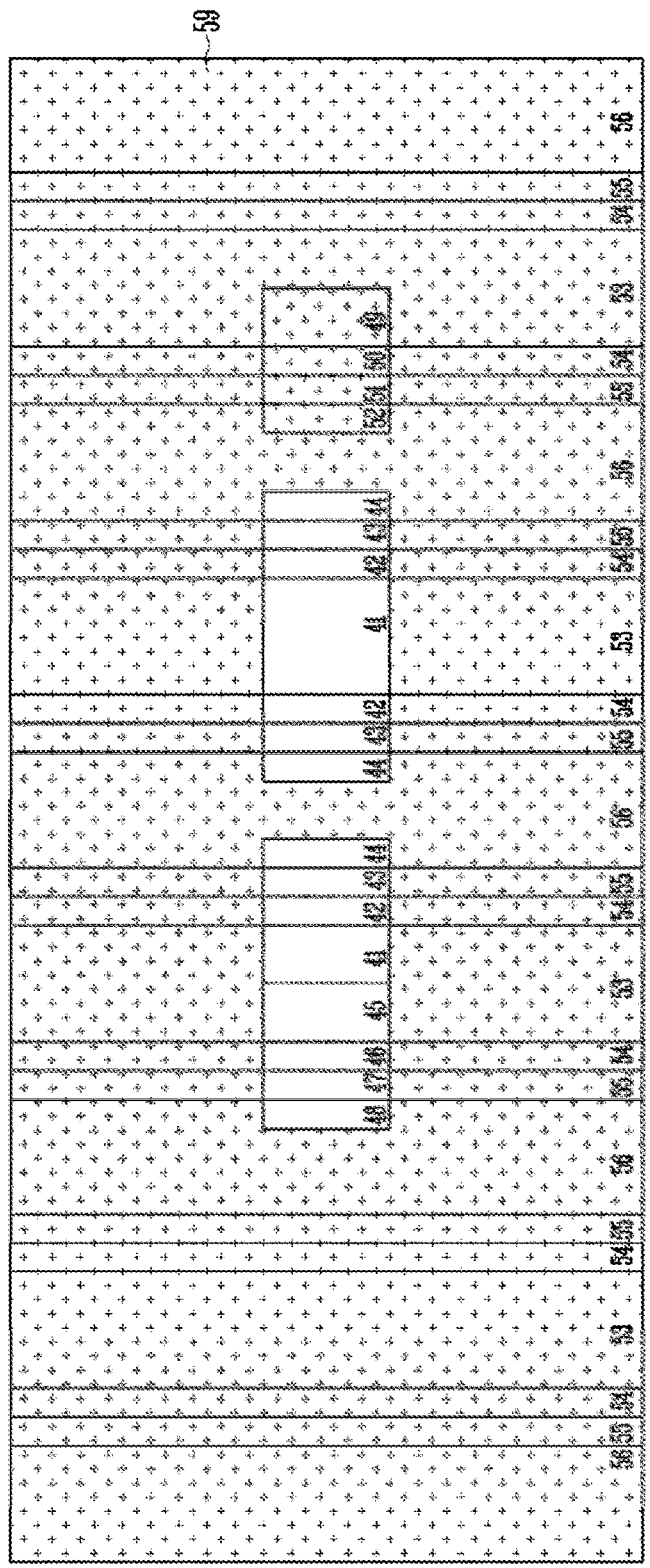

Referring to FIGS. 5A and 5B, stacked layers 45 to 56 of second to $n^{th}$ groups are formed on the stacked layers 41 to 44 of the first group G1. In this way, the stacked layers 41 to 56 may form a stack structure ST. The stack structure ST may include first and second cell structures, and a pad structure. The first cell structure may be a portion of the stack structure ST where the first cell region CR1 is formed. The second cell structure may be a portion of the stack structure ST where the second cell region CR2 is formed. The pad structure may be a portion of the stack structure ST where the pad region PR is formed. That is, different portions of the single stack structure ST may perform different functions.

Each of the layers 41 to 56 may include a first material layer C and a second material layer D. For example, in each of the layers 41 to 56, the first material layer C may be disposed on the second material layer D. Alternatively, the second material layer D may be disposed on the first material layer C.

The first material layers C are provided to form word lines, select lines, pads, etc., and the second material layers D are provided to insulate the stacked conductive layers from each other. For example, each of the first material layers C may be formed of a sacrificial layer including a nitride material or the like, and each of the second material layers D may be formed of an insulating layer including an oxide material or the like. Alternatively, each of the first material layers C may be formed of a conductive layer including polysilicon, tungsten, etc., and each of the second material layers D may be formed of an insulating layer including an oxide material or the like. As a further alternative, each of the first material layers C may be formed of a conductive layer including doped polysilicon or the like, and each of the second material layers D may be formed of a sacrificial layer including undoped polysilicon or the like.

The stacked layers 41 to 56 may be grouped depending on the shape of lines, the positions of pads, etc. In an example illustrated in FIGS. 5A and 5B, n is three, and thus the stacked layers 41 to 56 are grouped into three groups, which are a first group (41 to 44; G1), a second group (45 to 52; G2), and a third group (53 to 56; G3). Here, the shape of lines in the first group G1 differs from that of the second or third group G2, G3 in that it is additionally patterned by a first slit insulating layer SLI1. Furthermore, in the first and second groups G1 and G2, the pads are disposed in the central portion of the pad region PR, but the pads of the third group G3 are in contact with the cell structures. The number of stacked groups and the number of stacked layers included in each group may vary.

Subsequently, a first mask pattern 57 is formed on the stacked structure ST. The first mask pattern 57 includes first openings OP1 each of which has a line shape extending in the second direction II-II'. Thereafter, an $n^{th}$ group is partially patterned using the first mask pattern 57, and thus a plurality of stepped structures exposing layers of the $n^{th}$ group in a predetermined pattern.

For example, in the case where n is three, the layer 56 of the third group G3 is etched using the first mask pattern 57 as an etch barrier, and then the first mask pattern 57 is reduced such that a first opening OP1 extends in the first direction I-I'. Thereafter, the layers 55 and 56 of the third group G3 are etched using the reduced first mask pattern 57 as an etch barrier. In this way, the layers 53 to 56 of the third group G3 of each stepped structure may be exposed in a predetermined pattern by repeatedly performing an etching operation and an operation of reducing the first mask pattern 57. Thereby, the first line structure LS1, which includes the first lines L1 and the first dummy stepped structure DS1, and the second line structure LS2, which includes the second lines L2 and the second dummy stepped structure DS2, may be formed. Furthermore, the third stepped structure S3 in contact with the first cell structure CS1 and the fourth stepped structure S4 in contact with the second cell structure CS2 may be formed. Subsequently, the first mask pattern 57 is removed.

Referring to FIGS. 6A, 6B, 7A and 7B, the first to $(n-1)^{th}$ groups of the stacked structure ST are partially patterned to form a plurality of stepped structures exposing layers of the first to $(n-1)^{th}$ groups in predetermined patterns. For example, in the case where n is three, a plurality of stepped structures exposing layers of the first and second groups in predetermined patterns may be formed.

First, a second mask pattern 58 including second openings OP2 is formed on the stacked structure ST, and then the layers 50 to 53 are etched using the second mask pattern 58 as an etch barrier. Subsequently, the second mask pattern 58 is removed. Thereafter, a third mask pattern 59 including third openings OP3 is formed on the stacked structure ST, and then the layers 42 to 49 are etched using the third mask pattern 59 as an etch barrier. Thereby, a first stepped structure S1 and a second stepped structure S2 exposing the layers 41 to 52 in predetermined patterns may be formed.

The second and third mask patterns 58 and 59 are formed to cover the first and second line structures LS1 and LS2 and the third and fourth stepped structure S3 and S4. The second and third mask patterns 58 and 59 include the second and third openings OP2 and OP3, which have island shapes and expose regions where the first and second stepped structures S1 and S2 will be formed. Depending on the number of stacked layers, the second openings OP2 and the third openings OP3 may overlap, at least in part, each other. The second openings OP2 and the third openings OP3 may have the same width as each other. Alternatively, the second openings OP2 and the third openings OP3 may have different widths from each other. Furthermore, the number of etched layers may vary.

Figure 8A:
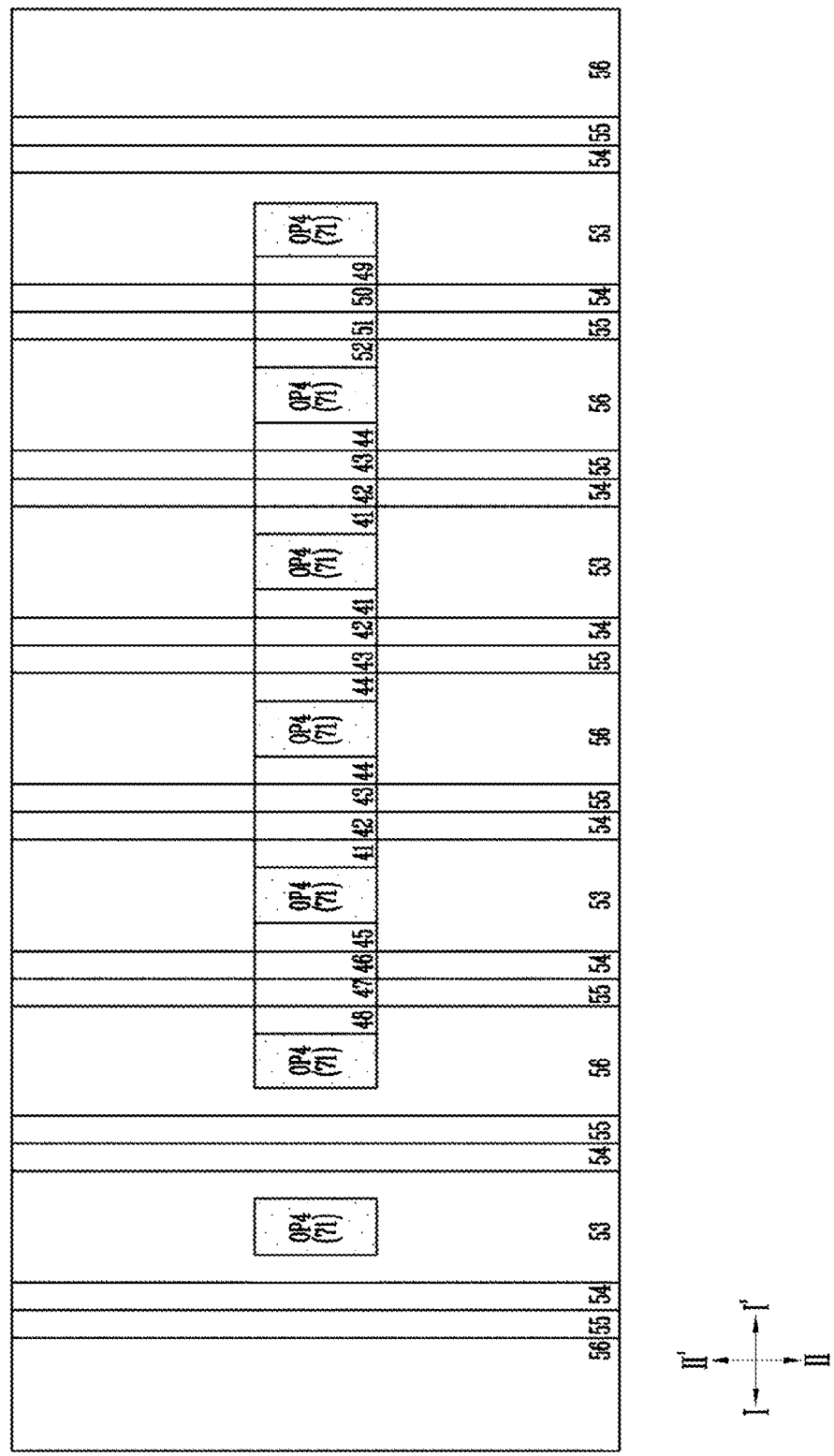
Figure 8B:
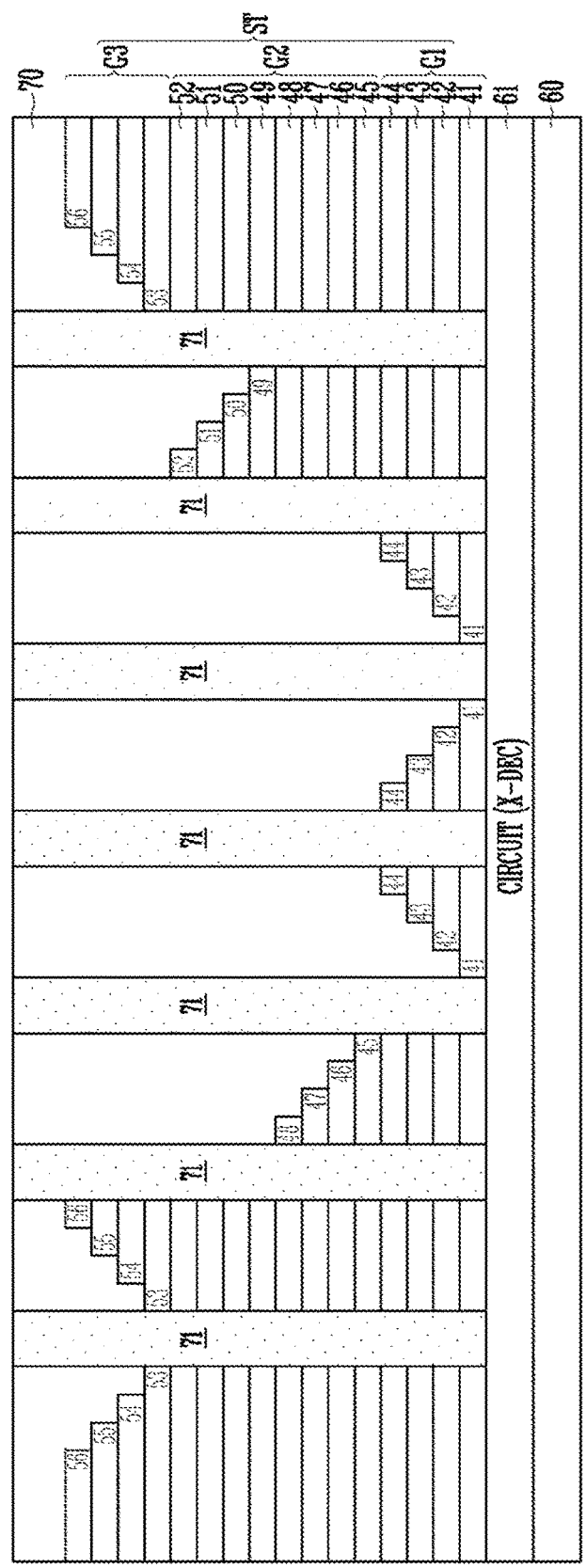

Referring to FIGS. 8A and 8B, an interlayer insulating layer 70 is formed on the stacked structure ST, and then fourth openings OP4 are formed in a manner that passes through the interlayer insulating layer 70 and the stacked structure ST. Thereafter, insulating patterns 71 are formed in the fourth openings OP4. For example, the fourth openings OP4 are formed in a manner that passes through the pad region PR, that is, the pad structure of the stacked structure ST. Each of the fourth openings OP4 has a depth to completely pass through the pad structure and expose the circuit 61.

Referring to FIG. 9, second to fifth slits SL2, SL3A, SL3B, SL4 and SL5 are formed in a manner that passes through the stacked structure ST. The second to fourth slits SL2, SL3A, SL3B and SL4 extend in the first direction I-I', and the fifth slit SL5 extends in the second direction II-II'. Furthermore, the third slit SL3A and the fifth slit SL5 intersect each other, and the third and fifth slits SL3B and SL5 and the first slit SL1 are coupled to each other in a C shape.

The second slits SL2 electrically separates adjacent memory blocks MB and are disposed on boundaries between the adjacent memory blocks MB. Each of the second slits SL2 has a depth to completely pass through the stacked layers 41 to 56. The fourth slits SL4 separate the drain select lines that are disposed at the same level, from each other, and each have a depth to pass through the layers 54 to 56, which are provided to be used as the drain select lines. The third slits SL3A and SL3B separate the source select lines that are disposed at the same level separate the drain select lines that are disposed at the same level and each have a depth to completely pass through the stacked layers 41 to 56. The third slit SL3A is disposed in the center of the memory block and traverses the plurality of the fourth openings OP4. Furthermore, the fifth slit SL5 separates the source select lines that are disposed at the same level and has a depth to completely pass through the stacked structures 41 to 56.

In an embodiment, the source select lines that are disposed at the same level are separated from each other by the first, third and fifth slits SL1, SL3A, SL3B and SL5. Furthermore, the drain select lines that are disposed at the same level are separated from each other by the third and fourth slits SL3A, SL3B and SL4.

The second to fifth slits SL2, SL3A, SL3B, SL4 and SL5 may be formed at the same time. Alternatively, two or more steps may be used to form the second to fifth slits SL2, SL3A, SL3B, SL4 and SL5. For example, the second, fourth, and fifth slits SL2, SL4, and SL5 are formed, and thereafter second, fourth, and fifth slit insulating layers are formed therein. Subsequently, the third slits SL3A and SL3B that intersect with the fifth slits SL5 are formed, and then third slit insulating layers are formed therein.

Furthermore, after slit insulating layers, which are provided to be used as supports, are formed in the second, fourth and fifth slits SL2, SL4 and SL5, an additional process using the third slits SL3A and SL3B may be performed. For example, in the case where the first material layers C are sacrificial layers and the second material layers D are insulating layers, conductive layers may substitute for the first material layers C. In another example, in the case the first material layers C are conductive layers and the second material layers D are insulating layers, the first material layers C may be silicidized. In addition, in the case the first material layers C are conductive layers and the second material layers D are sacrificial layers, insulating layers may substitute for the first material layers C.

Figure 10:
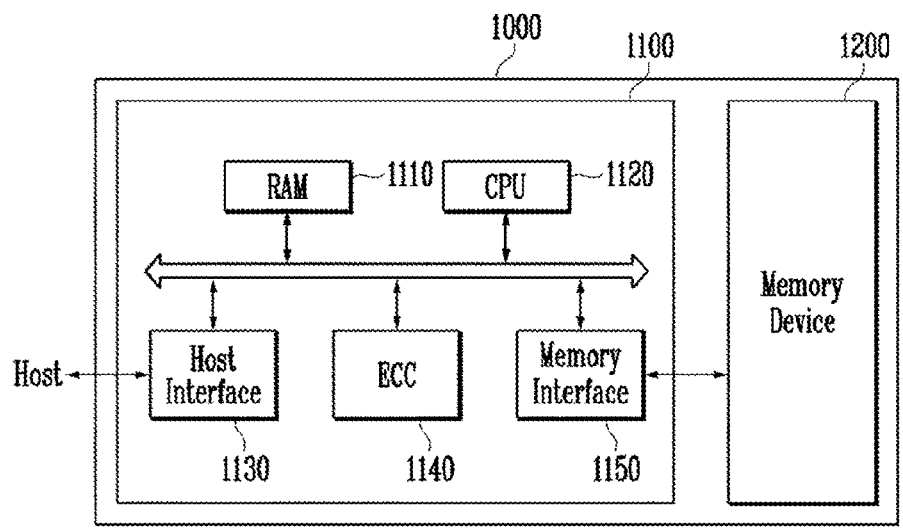
FIGS. 10 and 11 are diagrams illustrating an example configuration of a memory system according to an embodiment of the present disclosure.

FIG. 10 is a diagram illustrating an example configuration of a memory system according to an embodiment of the present disclosure.

Referring FIG. 10, the memory system 1000 according to an embodiment of the present invention includes a memory device 1200 and a controller 1100.

The memory device 1200 is used to store data information having various types of data such as text, graphics and software codes. The memory device 1200 may be a non-volatile memory and include the structure described with reference to FIGS. 1A to 9. In addition, the memory device 1200 may include a first cell structure, a second cell structure, a pad structure, a circuit, and one or more openings. The pad structure may be disposed between the first cell structure and the second cell structure, and may be electrically coupled to the first and second cell structures. The pad structure may have a plurality of stepped structures. The circuit may be disposed under the pad structure. The one or more openings may pass through the pad structures and expose the circuit. The one or more openings may be disposed between the plurality of stepped structures. The structure of the memory device 1200 and the manufacturing method thereof are the same as those described above; therefore detailed explanation thereof will be omitted.

The controller 1100 may be coupled to a host and the memory device 1200, and may access the memory device 1200 in response to a request from the host. For example, the controller 1100 may control read, write, remove, and background operations of the memory device 1200.

The controller 1100 may include a random access memory (RAM) 1110, a central processing unit (CPU) 1120, a host interface 1130, an error correction code (ECC) circuit 1140, a memory interface 1150, and so forth.

The RAM 1110 may be used as a main memory of the CPU 1120, a cache memory between the memory device 1200 and the host, a buffer memory between the memory device 1200 and the host, or the like. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors included in data read from the memory device 1200.

The memory interface 1150 may interface with the memory device 1200. For example, the memory interface 1150 may include a NAND interface or a NOR interface. For reference, the controller 1100 may further include a buffer memory (not illustrated) that temporarily stores data. The buffer memory may be used to temporarily store data to be transferred from the host interface 1130 to an external device or data to be transferred from the memory interface 1150 to the memory device 1200. The controller 1100 may further include a ROM for storing code data that is used to interface with the host.

Since the memory system 1000 according to an embodiment includes the memory device 1200 having improved integration density and characteristics, the memory system 1000 may be miniaturized while having good characteristics.

Figure 11:
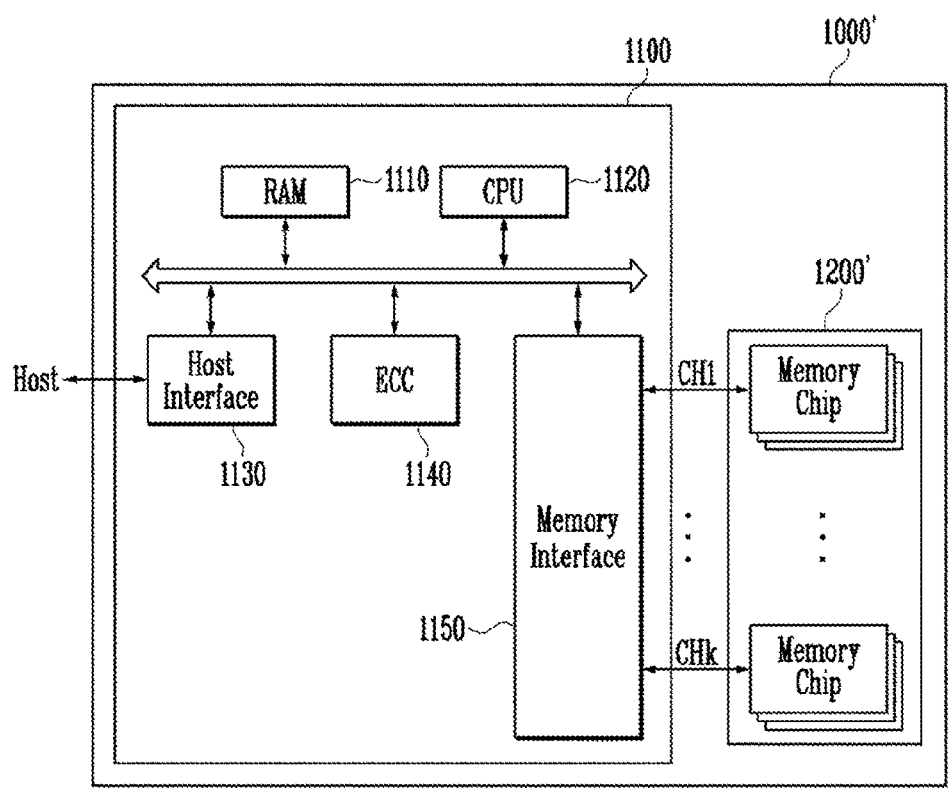

FIG. 11 is a diagram illustrating an example configuration of a memory system according to an embodiment of the present disclosure. Here, any repetitive detailed description will be omitted or simplified.

Referring to FIG. 11, the memory system 1000' according to an embodiment may include a memory device 1200' and a controller 1100. The controller 1100 may include a RAM 1110, a CPU 120, a host interface 1130, an ECC circuit 1140, a memory interface 1150, and so forth.

The memory device 1200' may be a non-volatile memory device, and may include the memory strings described above with reference to FIGS. 1A to 9. In addition, the memory device 1200 may include a first cell structure, a second cell structure, a pad structure, a circuit, and one or more openings. The pad structure may be disposed between the first cell structure and the second cell structure, and may be electrically coupled to the first and second cell structures. The pad structure may have a plurality of stepped structures. The circuit may be disposed under the pad structure. The one or more openings may pass through the pad structures and expose the circuit. The one or more openings may be disposed between the plurality of stepped structures. The structure of the memory device 1200' and the manufacturing method thereof are the same as those described above; therefore detailed explanation thereof will be omitted.

Furthermore, the memory device 1200' may be a multi-chip package including a plurality of memory chips. The plurality of memory chips are divided into a plurality of groups. The plurality of groups may communicate with the controller 1100 through first to $k^{th}$ channels CH1 to CHk. The memory chips of each group may be suitable for communicating with the controller 1100 through a common channel. The memory system 1000' may be modified such that each single memory chip is connected to a corresponding single channel.

As described above, according to an embodiment, since the memory system 1000' includes the memory device 1200' having improved integration density and characteristics, the memory system 1000' may be miniaturized while having good characteristics. The memory device 1200' may be fabricated in a form a multi-chip package to improve the data storage capacity of the memory system 1000' and to enhance the driving speed thereof.

Figure 12:
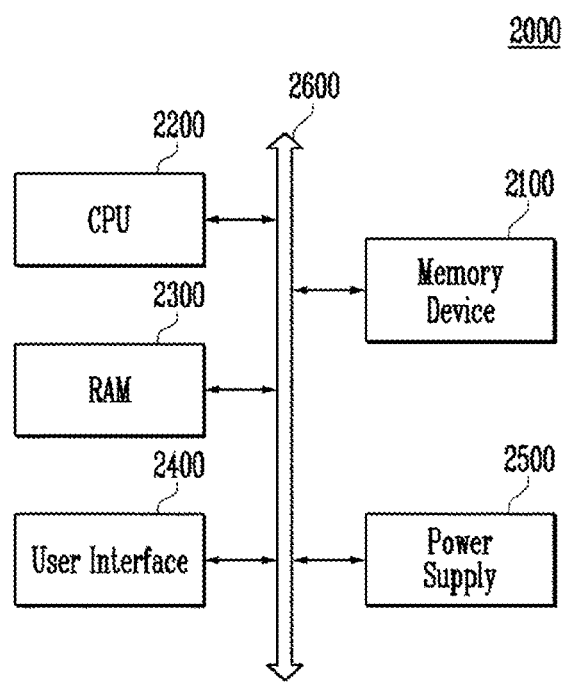
FIGS. 12 and 13 are diagrams illustrating an example of a computing system according to an embodiment of the present disclosure.

FIG. 12 is a diagram illustrating an example configuration of a computing system according to an embodiment of the present disclosure. Here, any repetitive detailed description will be omitted or simplified.

Referring to 12, the computing system 2000 according to an embodiment of the present disclosure may include a memory device 2100, a CPU 2200, a RAM 2300, a user interface 2400, a power supply 2500, a system bus 2600, and so forth.

The memory device 2100 may store data provided via the user interface 2400, data processed by the CPU 2200, etc. The memory device 2100 may be electrically coupled to the CPU 2200, the RAM 2300, the user interface 2400, the power supply 2500, etc. by the system bus 2600. For example, the memory device 2100 may be coupled to the system bus 2600 via a controller (not illustrated). Alternatively, the memory device 2100 may be directly connected to the system bus 2600. In the case where the memory device 2100 is directly connected to the system bus 2600, the function of the controller may be performed by the CPU 2200, the RAM 2300, etc.

The memory device 2100 may be a non-volatile memory and include the memory strings described above with reference to FIGS. 1A to 9. In addition, the memory device 2100 may include a first cell structure; a second cell structure; a pad structure, a circuit, and one or more openings. The pad structure may be disposed between the first cell structure and the second cell structure, and may be electrically coupled to the first and second cell structures. The pad structure may have a plurality of stepped structures. The circuit may be disposed under the pad structure. The one or more openings may pass through the pad structures and expose the circuit. The one or more openings may be disposed between the plurality of stepped structures. The structure of the memory device 2100 and the manufacturing method thereof are the same as those described above; therefore detailed explanation thereof will be omitted.

In addition, as described above with reference to FIG. 11, the memory device 2100 may be a multi-chip package configured with a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to an embodiment includes the memory device 2100 having improved integration density and characteristics, the computing system 2000 may be miniaturized while having good characteristics.

Figure 13:
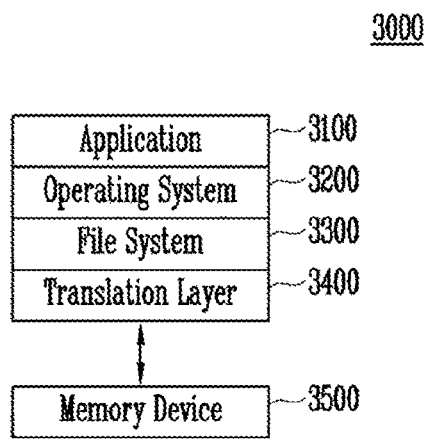

FIG. 13 is a diagram illustrating a computing system according to an embodiment of the present disclosure.

Referring to FIG. 13, the computing system 3000 according to an embodiment of the present disclosure may include a software layer containing an operating system 3200, an application 3100, a file system 3300, a translation layer 3400, and so forth. The computing system 300 may include a hardware layer such as a memory device 3500.

The operating system 3200 may manage software resources and hardware resources, etc. of the computing system 3000 and control program execution of a CPU. The application 3100 may include various application programs executed by the computing system 3000, and may be a utility executed by the operating system 3200.

The file system 3300 may refer to a logical structure that is provided to control data, files, etc. in the computing system 3000. The file system 3300 may organize files or data to be stored in the memory device 3500 or the like according to a given rule. The file system 3300 may be determined depending on the operating system 3200 used in the computing system 3000. For example, if the operating system 3200 is Microsoft's Windows-based system, the file system 3300 may be a file allocation table (FAT), an NT file system (NTFS), or the like. If the operating system 3200 is a Unix/Linux-based system, the file system 3300 may be an extended file system (EXT), a Unix file system (UFS), a journaling file system (JFS), or the like.

Although the operating system 3200, the application 3100 and the file system 3300 are expressed as separate blocks in the drawing, the application 3100 and the file system 3300 may be included in the operating system 3200.

The translation layer 3400 may translate an address into a suitable form for the memory device 3500 in response to a request from the file system 3300. For example, the translation layer 3400 may translate a logical address produced by the file system 3300 into a physical address of the memory device 3500. Mapping information of the logical address and physical address may be stored in an address translation table. For example, the translation layer 3400 may be a flash translation layer (FTL), a universal flash storage link layer (ULL), or the like.

The memory device 3500 may be a non-volatile memory. The memory device 3500 may include the memory strings described above with reference to FIGS. 1A to 9. In addition, the memory device 3500 may include a first cell structure, a second cell structure, a pad structure, a circuit, and one or more openings. The pad structure may be disposed between the first cell structure and the second cell structure, and may be electrically coupled to the first and second cell structures. The pad structure may have a plurality of stepped structures. The circuit may be disposed under the pad structure. The one or more openings may pass through the pad structures and expose the circuit. The one or more openings may be disposed between the plurality of stepped structures. The structure of the memory device 3500 and the manufacturing method thereof are the same as those described above; therefore detailed explanation thereof will be omitted.

The computing system 300 having the above-mentioned configuration may be divided into an operating system layer which is operated in an upper level region and a controller layer which is operated in a lower level region. The application 3100, the operating system 3200, and the file system 3300 may be included in the operating system layer and driven by an operating memory of the computing system 3000. The translation layer 3400 may be included in the operating system layer or the controller layer.

As described above, since the computing system 3000 according to the embodiment includes the memory device 3500 having improved integration density and characteristics, the computing system 3000 may be miniaturized while having good characteristics.

In accordance with embodiments, the program speed may be improved by reducing the distance between a circuit and a cell structure. In addition, the integration density may be improved by reducing the area of a pad region, and the manufacturing process may be simplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
   a circuit;
   a pad structure disposed over the circuit, the pad structure comprising a first stepped structure including first pads stacked on top of one another, a second stepped structure including second pads stacked on top of one another, and a third stepped structure including third pads stacked on top of one another;
   a first opening disposed between the first stepped structure and the second stepped structure and passing through the pad structure and expose the circuit;
   a second opening disposed between the second stepped structure and the third stepped structure and passing through the pad structure and expose the circuit;
   a first interconnection structure electrically coupling the first pads and the third pads to each other and coupling the first and third pads to the circuit through the first opening or the second opening; and
   a second interconnection structure electrically coupling the second pads to each other and coupling the second pads to the circuit through the first opening or the second opening.

2. The semiconductor device of claim 1, wherein the first stepped structure and the second stepped structure are symmetrical about the first opening, and each of the first and second stepped structure has a stepped shape in which a height of a portion of the stepped structure is increased as the portion of the stepped structure gets closer to the first opening.

3. The semiconductor device of claim 1, wherein the second stepped structure and the third stepped structure are symmetrical about the second opening, and each of the second and third stepped structures has a stepped shape in which a height of a portion of the stepped structure is decreased as the portion of the stepped structure gets closer to the second opening.

4. The semiconductor device of claim 1, wherein the pad structure comprises:
   a first line structure including first lines stacked on top of one another, the first lines being electrically coupled to the respective first pads;
   a second line structure including second lines stacked on top of one another, the second lines being electrically coupled to the respective second pads; and
   a third line structure including third lines stacked on top of one another, the third lines being electrically coupled to the respective third pads, and
   wherein, among the first to third lines, first to third lines that are disposed at the same level are insulated from each other.

5. The semiconductor device of claim 4, further comprising:
   a first cell structure including first source select lines stacked on top of one another and second source select lines stacked on top of one another, and being formed such that, among the first and second source select lines, a first source select line and a second source select line that are disposed at the same level are insulated from each other; and
   a second cell structure including third source select lines stacked on top of one another and fourth source select lines stacked on top of one another, and being formed such that, among the third and fourth source select lines, a third source select line and a fourth source select line that are disposed at the same level are insulated from each other,
   wherein the first lines are electrically coupled to the respective second source select lines, each of the second lines is coupled in common, among the first and third source select lines, to a first source select line and a third source select line that are disposed at the same level, and the third lines are electrically coupled to the respective fourth source select lines.

6. A semiconductor device comprising:
   a first cell structure;
   a second cell structure;
   a pad structure disposed between the first cell structure and the second cell structure and electrically coupled to the first and second cell structures, the pad structure having a plurality of stepped structures;
   a circuit disposed under the pad structure; and
   one or more openings passing through the pad structure and exposing the circuit, the one or more openings being disposed between the plurality of stepped structures.

7. The semiconductor device of claim 6, wherein the plurality of stepped structures comprise:

a first stepped structure comprising first pads stacked on top of one another, the first pads being electrically coupled to the first cell structure;
a second stepped structure comprising second pads stacked on top of one another, the second pads being electrically coupled to the first and second cell structures; and
a third stepped structure comprising third pads stacked on top of one another, the third pads being electrically coupled to the second cell structure.

8. The semiconductor device of claim 7, wherein the openings comprise:
a first opening disposed between the first stepped structure and the second stepped structure and formed to insulate the first pads and the second pads from each other; and
a second opening disposed between the second stepped structure and the third stepped structure and formed to insulate the second pads and the third pads from each other.

9. The semiconductor device of claim 7, further comprising:
a first interconnection structure electrically coupling the first pads and the third pads to each other and coupling the first and third pads to the circuit through the openings; and
a second interconnection structure electrically coupling the second pads to each other and coupling the second pads to the circuit through the openings.

10. The semiconductor device of claim 7, wherein the pad structure comprises:
a first line structure comprising first lines stacked on top of one another, the first lines being electrically coupled to the respective first pads;
a second line structure comprising second lines stacked on top of one another, the second lines being electrically coupled to the respective second pads; and
a third line structure comprising third lines stacked on top of one another, the third lines being electrically coupled to the respective third pads, and
wherein, among the first to third lines, first to third lines that are disposed at the same level are insulated from each other.

11. The semiconductor device of claim 10, wherein:
the first cell structure includes first source select lines stacked on top of one another and second source select lines stacked on top of one another, and among the first and second source select lines, a first source select line and a second source select line that are disposed at the same level are insulated from each other; and
the second cell structure includes third source select lines stacked on top of one another and fourth source select lines stacked on top of one another, and among the third and fourth source select lines, a third source select line and a fourth source select line that are disposed at the same level are insulated from each other.

12. The semiconductor device of claim 11, wherein:
the first lines are electrically coupled to the respective first source select lines;
each of the second lines is coupled in common, among the second and third source select lines, to a second source select line and a third source select line that are disposed at the same level; and
the third lines are electrically coupled to the respective fourth source select lines.

13. The semiconductor device of claim 7, further comprising:

a slit insulating layer extending in one direction to traverse the openings and passing through the pad structure in a stacking direction;
a fourth stepped structure facing the first stepped structure such that the slit insulating layer is disposed between the first and fourth stepped structures, the fourth stepped structure comprising fourth pads stacked on top of one another, the fourth pads being electrically coupled to the first cell structure;
a fifth stepped structure facing the second stepped structure such that the slit insulating layer is disposed between the second and fifth stepped structures, the fifth stepped structure comprising fifth pads stacked on top of one another, the fifth pads being electrically coupled to the first and second cell structures; and
a sixth stepped structure facing the third stepped structure such that the slit insulating layer is disposed between the third and sixth stepped structures, the sixth stepped structure comprising sixth pads stacked on top of one another, the sixth pads being electrically coupled to the second cell structure.

14. The semiconductor device of claim 13, wherein the openings comprise:
a first opening disposed between the first and fourth stepped structures and the second and fifth stepped structures and formed to insulate the first and fourth pads from the second and fifth pads; and
a second opening disposed between the second and fifth stepped structures and the third and sixth stepped structures and formed to insulate the second and fifth pads from the third and sixth pads.

15. The semiconductor device of claim 13, further comprising:
a first interconnection structure electrically coupling the first pads and the third pads to each other and coupling the first and third pads to the circuit through the openings;
a second interconnection structure electrically coupling the second pads with each other and coupling the second pads to the circuit through the openings;
a third interconnection structure configured to electrically coupling the fourth pads and the sixth pads to each other and coupling the fourth and sixth pads to the circuit through the openings; and
a fourth interconnection structure configured to electrically coupling the fifth pads to each other and coupling the fifth pads to the circuit through the openings.

16. The semiconductor device of claim 13, wherein the pad structure comprises:
a first line structure comprising first lines stacked on top of one another, the first lines being electrically coupled to the respective first pads;
a second line structure comprising second lines stacked on top of one another, the second lines being electrically coupled to the respective second pads;
a third line structure comprising third lines stacked on top of one another, the third lines being electrically coupled to the respective third pads;
a fourth line structure comprising fourth lines stacked on top of one another, the fourth lines being electrically coupled to the respective fourth pads;
a fifth line structure comprising fifth lines stacked on top of one another, the fifth lines being electrically coupled to the respective fifth pads; and
a sixth line structure comprising sixth lines stacked on top of one another, the sixth lines being electrically coupled to the respective sixth pads, wherein, among the first to sixth lines, first to sixth lines that are disposed at the same level are insulated from each other.

17. The semiconductor device of claim 16, wherein:

the first cell structure comprises first to fourth source select lines insulated from each other, and the second cell structure comprises fifth to eighth source select lines insulated from each other;

the first lines are electrically coupled to the respective second source select lines;

each of the second lines is coupled in common, among the first and fifth source select lines, to a first source select line and a fifth source select line that are disposed at the same level;

the third lines are electrically coupled to the respective sixth source select lines;

the fourth lines are electrically coupled to the respective third source select lines;

each of the fifth lines is coupled in common, among the fourth and eighth source select lines, to a fourth source select line and an eighth source select line that are disposed at the same level; and the sixth lines are electrically coupled to the respective seventh source select lines.

18. The semiconductor device of claim 7, wherein the first stepped structure and the second stepped structure are symmetrical, and the second stepped structure and the third stepped structure are symmetrical.

* * * * *